(12) United States Patent
Yap et al.

(10) Patent No.: US 11,251,209 B1
(45) Date of Patent: Feb. 15, 2022

(54) REDUCED VOLUME DUAL-BAND MWIR DETECTOR

(71) Applicant: HRL LABORATORIES LLC, Malibu, CA (US)

(72) Inventors: Daniel Yap, Newbury Park, CA (US); Rajesh D. Rajavel, Oak Park, CA (US); Sarabjit Mehta, Calabasas, CA (US); Terence J. De Lyon, Newbury Park, CA (US); Hasan Sharifi, Agoura Hills, CA (US); Pierre-Yves Delaunay, Santa Monica, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/213,809

(22) Filed: Mar. 14, 2014

Related U.S. Application Data

(60) Provisional application No. 61/791,564, filed on Mar. 15, 2013.

(51) Int. Cl.
*H01L 27/144* (2006.01)
*H01L 31/0352* (2006.01)
(Continued)

(52) U.S. Cl.
CPC .... *H01L 27/1446* (2013.01); *H01L 31/02363* (2013.01); *H01L 31/035236* (2013.01); *H01L 31/1013* (2013.01); *H01L 31/18* (2013.01)

(58) Field of Classification Search
CPC ........... H01L 31/0236; H01L 31/02366; H01L 31/09; H01L 31/101; H01L 31/1013; H01L 31/02363
See application file for complete search history.

(56) References Cited

U.S. PATENT DOCUMENTS

| 5,113,076 A | 5/1992 | Schulte |
| 6,184,538 B1 * | 2/2001 | Bandara ................. B82Y 20/00 250/338.4 |
| 6,897,447 B2 | 5/2005 | Mitra |
| 7,129,489 B2 | 10/2006 | Pham |

(Continued)

OTHER PUBLICATIONS

Klipstein et al. 'XBn barrier detectors for high operating temperatures,' Proc. SPIE 7608 Quantum Sensing and Nanophotonic Devices VII, 76081V-1-10 (Year: 2010).*

(Continued)

*Primary Examiner* — Bryan R Junge
(74) *Attorney, Agent, or Firm* — Lewis Roca Rothgerber Christie LLP

(57) ABSTRACT

An infrared photo-detector array and a method for manufacturing it are disclosed. The infrared photo-detector array contains a plurality of pyramid-shaped structures, a first light-absorbing material supporting the plurality of the pyramid-shaped structure, a carrier-selective electronic barrier supporting the first light-absorbing material, a second light-absorbing material supporting the carrier-selective electronic barrier, and a metal reflector supporting the second light-absorbing material, wherein the plurality of the pyramid shaped structures are disposed on the side of the photo-detector array facing the incident light to be detected and the metal reflector is disposed on the opposite side of the photo-detector array. The method disclosed teaches how to manufacture the infrared photo-detector array.

29 Claims, 24 Drawing Sheets

(51) Int. Cl.
  *H01L 31/18* (2006.01)
  *H01L 31/101* (2006.01)
  *H01L 31/0236* (2006.01)

(56) References Cited

U.S. PATENT DOCUMENTS

| | | | |
|---|---|---|---|
| 7,608,830 B1 | 10/2009 | Kinch | |
| 7,928,389 B1 * | 4/2011 | Yap | H01L 31/0236 250/338.4 |
| 8,969,986 B1 | 3/2015 | Yap et al. | |
| 9,146,157 B1 | 9/2015 | Rajavel et al. | |
| 2008/0111152 A1 * | 5/2008 | Scott | H01L 27/14603 257/188 |
| 2011/0041901 A1 * | 2/2011 | Shim et al. | 136/255 |
| 2011/0095334 A1 * | 4/2011 | Scott | H01L 31/1013 257/188 |
| 2013/0228887 A1 * | 9/2013 | Wehner | H01L 27/1446 257/432 |

OTHER PUBLICATIONS

Plis et al. 'nBn based infrared detectors using type-II InAs/(In,Ga)Sb superlattices,' Proc. SPIE 6940 Infrared Technology and Applications XXXIV, 69400E-1-10 (Year: 2008).*

Maimon et al. 'nBn detector, an infrared detector with reduced dark current and higher operating temperature,' Appl. Phys. Lett., 89, 151109 (Year: 2006).*

G. Destefanis, et al., "Advanced MCT technologies in France," Proceedings of SPIE vol. 6542 (2007), p. 65420D, 17 pages.

A. Khoshaklagh, et al., "Bias dependent dual band response from InAs/Ga(In)Sb type II strain layer superlattice detectors," Applied Physics Letters, vol. 91 (2007), p. 263504, 3 pages.

S. Myers, et al., "Comparison of superlattice based dual color nBn and pBp infrared detectors," Proceedings of SPIE vol. 8155 (2011), p. 815507, 9 pages.

D. Yap, et al., "Wideband detector with thin absorber," U.S. Appl. No. 13/372,366, filed Feb. 13, 2012.

* cited by examiner

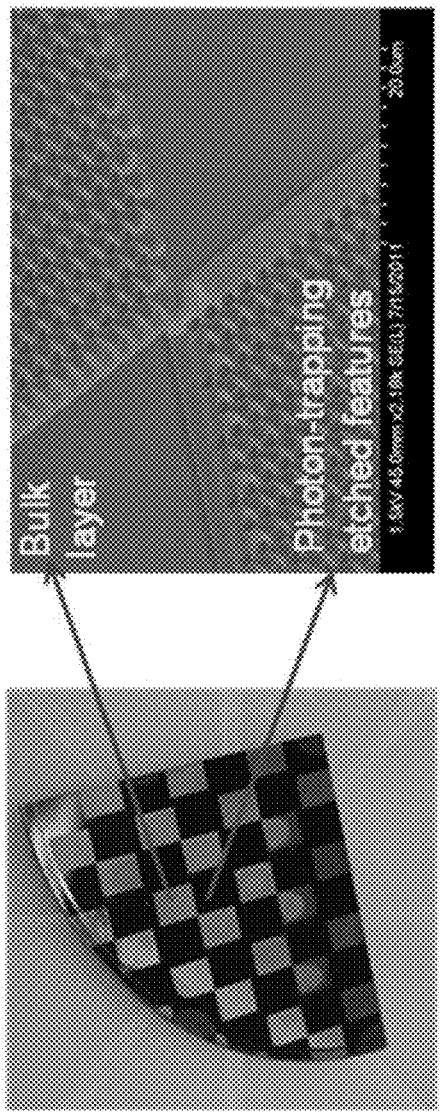
FIG. 25
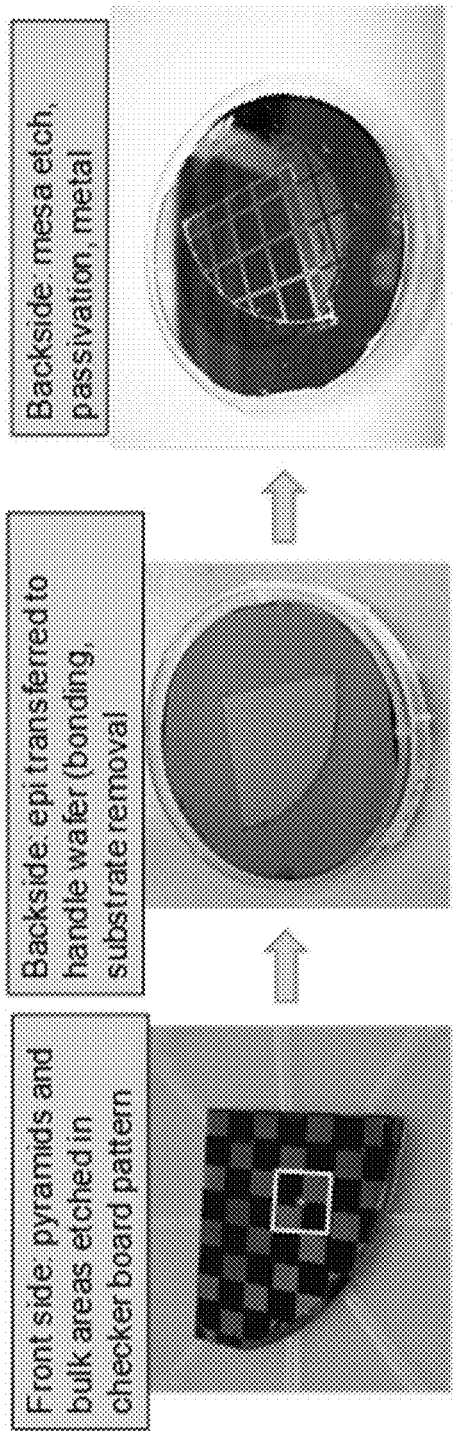
FIG. 26a
FIG. 26b
FIG. 26c

REDUCED VOLUME DUAL-BAND MWIR DETECTOR

CROSS REFERENCE TO RELATED APPLICATIONS

This application claims the benefit of U.S. Provisional Application No. 61/791,564, filed on Mar. 15, 2013, which is incorporated herein by reference in its entirety.

STATEMENT REGARDING FEDERALLY SPONSORED RESEARCH OR DEVELOPMENT

The present invention was made with support from the United States Government. The United States Government has certain rights in the invention.

FIELD

The present invention relates to detectors. More particularly, the present invention relates reduced volume dual-band Mid-Wavelength InfraRed (MWIR) detector.

BACKGROUND

Most prior detectors of infrared imagers have pixels that are defined by etching mesa structures that contain the light absorbing layer. An example of a widely used dual-band detector structure is shown in FIGS. 1a-b. In this structure, the light absorbing regions for the two wavelength bands are stacked directly above each other and both of these light-absorbing layers are located within the same mesa as described in an article by G. Destefanis, et al., "Advanced MCT technologies in France," Proceedings SPIE Vol. 6542 (2007), p. 65420D, which is incorporated herein by reference in its entirety. Each pixel consists of two back-to-back P-N photodiodes that are separated by a wide bandgap layer. Each pixel has one pixel-specific independent contact and also has a contact that is common to the other pixels of the array. The two photodiodes of a pixel are electrically contacted and biased through the single contact located on the top of the mesa and through the array-common contact located on the substrate side of the structure. By switching the bias voltage for a pixel from a positive value to a negative value, it is possible to extract the photo-detected signal from one or the other P/N junction photodiode of a back-to-back pair. Separate operation of those two photodiodes is obtained by having a wide bandgap layer between the two p-type layers of the two photodiodes. This wide bandgap layer blocks the flow of charge-carrier electrons between those two photodiodes.

Other forms of switched dual band detectors have been described in the past. For example, the detector can have a PNP structure that has a p-type absorbing layer for the shorter-wavelength light and another p-type absorbing layer for the longer-wavelength light as described by E. F. Shulte, "Two terminal multi-band infrared radiation detector," U.S. Pat. No. 5,113,076, issued 12 May 1992, which is incorporated herein by reference in its entirety. These two layers are separated by another layer that is n-type and that also has a much larger electronic bandgap, as shown in FIGS. 2a-b. The intervening layer prevents the flow of the photo-generated majority carrier holes between the two absorber layers. The flow of the minority carrier electrons between the two absorber layers can be permitted, but only in one direction, with the direction of carrier flow depending on the sign of the applied bias voltage. Essentially, one PN junction of this device is reverse biased and can produce a photo-current. The other PN junction is forward biased and does not produce a photo-current. However, that forward-biased PN junction does conduct the photo-current produced by the other PN junction. For this detector, the pixel-distinguishing mesa is formed by etching through both the longer-wavelength layer and the intervening, hole-blocking layer.

Other bias-switched dual-band detectors having a single detector-specific electrical output per detector can have their output switched between the photo-current of a single, longer-wavelength band and the photo-current of both bands. The value of the photo-current for the other, shorter-wavelength band would then be determined by subtracting the value of the longer-wavelength photo-current signal from the value of the dual-band photo-current signal. FIGS. 3a-b show one example of such a photodetector as described by Le Thanh Pham, "Method and apparatus providing single bump, multi-color pixel architecture," U.S. Pat. No. 7,129,489 B2, issued 31 Oct. 2006, which is incorporated herein by reference in its entirety. This detector has a barrier layer located between the absorber layers for the light in the two wavelength bands, $\lambda 1$ and $\lambda 2$. This barrier blocks the flow of photo-generated electrons from the shorter-wavelength band $\lambda 1$ through it to the output contact but permits the flow of photo-generated holes from the longer-wavelength band $\lambda 2$ in the opposite direction to the other output contact. Thus, only the photo-current for the longer-wavelength band is collected. However, an applied voltage can lower that barrier such that the photo-generated electrons from the shorter-wavelength band $\lambda 1$ can pass through. In that case, both photo-currents, for the shorter-wavelength band as well as the longer-wavelength band, are collected.

In another prior detector (illustrated in FIGS. 4a-b), the switching between a single-band photo-current output and a dual-band photo-current output is obtained from a structure that uses the difference between the bandgap and the doping of the light absorbers for the two bands to produce an effective barrier to the flow of the photo-generated electrons from the longer-wavelength absorber layer through that barrier and then through the shorter-wavelength absorber layer to be collected as described by M. A. Kinch, "Separate absorption and detection diode for two-color operation," U.S. Pat. No. 7,608,830 B1, issued 27 Oct. 2009, which is incorporated herein by reference in its entirety. Thus, only the photo-current for the shorter-wavelength band is output. However, an applied voltage and removes this barrier and then both photo-currents are output from the device.

With the prior dual-band detectors described above, the light to be detected is incident from the substrate side of the device. The side of the substrate opposite the absorbers can be coated with an anti-reflective coating to increase the amount of light coupled into the substrate and then into the light-absorbing regions. With these prior detectors, the light-absorbing layers are quite thick, with a thickness that is typically 1.5 to 2 times greater than the wavelength of the light in the band to be detected by that layer. Despite having thick absorber layers, the quantum efficiency of the prior detectors still is fairly low, a quantum efficiency of 60% was obtained for a structure with anti-reflection coated input surface (see article by Destefanis cited above).

FIG. 5 shows a prior photodetector structure that has dual-band light-absorbing regions contained in a periodically spaced set of elongated walls. The periods, in two orthogonal directions, are selected to form a diffractive resonant optical cavity for two specific wavelengths of the incident light as described by P. Mitra, "Bias controlled multi-spectral infrared photodetector and imager," U.S. Pat.

No. 6,897,447 B2, issued 24 May 2005, which is incorporated herein by reference in its entirety. The structure also contains a doped contact layer and a metal reflector that are underneath the light-absorbing walls. For this structure, the light-absorbing regions for both bands of the light are located within the walls. Light is incident from the side of the structure with the walls, and opposite the side with the metal reflector. The bandwidth of the spectral response (or the absorbance spectrum) for this structure has a pair of fairly narrow absorption peaks, with the peak width being roughly 10% of the resonance wavelength. However, for many applications, it is desirable to have absorption bands that are much wider than this, with bandwidths that are 50-100% of the center wavelength for each band.

The prior dual-band detectors described above have light-absorbing regions comprised of HgCdTe materials. Other prior dual-band MWIR1/MWIR2 or MWIR/LWIR detectors have light-absorbing regions comprised of InAs/GaSb or InAs/GaInSb type-II, strained-layer-superlattice (SLS) materials. An article by A. Khoshaklagh, et al. "Bias dependent dual band response from InAs/Ga(In)Sb type II strain layer superlattice detectors," Applied Physics Letters, vol. 91 (2007), p. 263504, which is incorporated herein by reference in its entirety and an article by S. Myers, et al. Comparison of superlattice based dual color nBn and pBp infrared detectors," Proceedings of SPIE Volume 8155 (2011), p. 815507, which is incorporated herein by reference in its entirety, describe detectors that have n-type SLS light-absorbing layers for both wavelength bands and a barrier layer of n-type AlGaSb between those two light-absorbing layers. The barrier blocks the flow of majority-carrier electrons but permits the flow of minority-carrier holes between the two light-absorbing layers, as illustrated in FIG. 6a. The nBn device was shown to have significantly lower dark-current density than a PiN diode device. The article by Myers, et al. also describes a detector that has p-type SLS light-absorbing layers for both wavelength bands and a p-type barrier comprised of an InAs/AlSb SLS that is located between those two light-absorbing layers. This barrier blocks the flow of majority-carrier holes but permits the flow of minority-carrier electrons between the two light-absorbing layers, as illustrated in FIG. 6b. For the pBp structure, generation/recombination mechanisms in the carrier-depleted regions of the structure dominate the bulk thermal generation processes, which contribute a diffusion noise current, for temperatures below 170 K.

The prior dual-band detector arrays have generally been operated and tested at a device temperature of 77 K. At this temperature, the dark-current noise is determined primarily by the thermal generation processes in the carrier-depleted junctions of the device. There is a need to achieve detectors that can operate at higher temperatures, such as 130-150 K or even approaching 200 K, and still have background limited noise performance. At these higher device temperatures, the thermal generation of carriers in the light-absorbing regions for the longer-wavelength band also can contribute to or even can dominate the dark-current noise. As a result, there is a need to reduce the volume of the absorber material, especially for the longer-wavelength absorber, as well as reduce the junction area and still achieve high quantum efficiency for conversion from incident photons to output electrical carriers.

FIG. 7 depicts a single band detector (albeit having very wide bandwidth) that can achieve high quantum efficiency with a reduced volume of its light-absorbing material. This detector contains multiple pyramid shaped features formed in each pixel, with those pyramids located on the side of the detector facing the incident light as described by D. Yap, et al., "Wide bandwidth infrared detector and imager," U.S. Pat. No. 7,928,389, issued 19 Apr. 2011, which is incorporated herein by reference in its entirety. The pyramids are etched into a moderately thin light absorbing layer, with the overall thickness of that light-absorbing layer being roughly equal to the longest wavelength of the light to be absorbed. The pyramids are etched only partly through the light-absorbing layer so that there remains a physically continuous base region of the light-absorbing layer to permit the majority carriers to be conducted to electrical contacts formed at the edges of the detector array. This detector also contains mesas etched through the heavily doped collector or extractor layer of the P/N diode. The mesas are not formed in the main light-absorbing layer and the mesas face away from the incident light. The pixel-specific electrical contact for a given pixel is formed onto these collector mesas. The spatial extent of a given pixel is defined by the electrical contact made to these mesas. There can be more than one mesa for each pixel and there are multiple pyramids in each pixel.

For detector shown in FIG. 7, the light is incident from the side containing the pyramids rather than from the substrate side of the detector. Thus, this detector is unlike the prior detectors illustrated in FIGS. 1-3a-b. The pyramid-shaped regions of the light-absorbing layer do not specifically define the extent of a pixel but rather they extend throughout the light-facing surface of the array. Instead, the pixel is defined by the extent of the electrical contact made to the one or more collector mesas comprising a pixel. The electrical contact made to the light-absorbing layer is the common contact of the detector array.

FIG. 8 depicts another single band detector (likewise having very wide bandwidth) that has only a thin layer of light-absorbing material. This detector contains multiple pyramid shaped features formed in each pixel, with those pyramids being transparent to the wavelengths of light to be absorbed as described by D. Yap and R. D. Rajavel, "Wideband Detector Structures," U.S. application Ser. No. 13/372,366, filed Feb. 13, 2012, which is incorporated herein by reference in its entirety. Those pyramids are located on the side of the detector facing the incident light. The pyramids are located above the thin and laterally continuous light absorbing layer. Although the thickness of the light-absorbing layer is much less than the 1/e absorption length for that material, it is possible to achieve quantum efficiency well above 80% over the entire wide bandwidth sensed by this detector. Deep dips in the absorption spectrum, at which wavelengths the absorption is greatly reduced, are avoided by forming multi-stepped mesas of the collector regions and/or oxide spacers of various thickness that separate the light-absorbing layer from a metal reflector at the backside of the device.

FIG. 9 depicts a dual-band detector with a reduced volume of the light-absorbing material for the longer-wavelength band as described by D. Yap, et al., U.S. application Ser. No. 13/036,403 "Infrared Detector" Filed on Feb. 28, 2011, which is incorporated herein by reference in its entirety. Light is incident from the substrate side of that device, as illustrated in FIG. 9. For that detector, the growth substrate is preferably thinned but does not need to be removed completely. Pyramids are formed in the thinned substrate and serve to improve the coupling of light into the light absorbing regions. The light absorbing regions for the longer-wavelength band are laterally separated from each other and are surrounded by voids that may be filled with a transparent, low-refractive-index material. A metal reflector at the backside of the detector acts in combination with these trapezoidal shaped light-absorbing regions to achieve efficient trapping and absorption of the light. The light-absorbing region for the shorter-wavelength band is a laterally contiguous layer. This prior detector has a single electrical output per pixel as well as an array common output. Thus, the dual-band operation is achieved by switching the bias voltage applied to a detector pixel.

In view of the limitation in prior art, a need exists for improved detectors.

BRIEF DESCRIPTION OF THE FIGURES

FIG. 25 depicts another embodiment according to the present disclosure.
FIGS. 26a-c depict another embodiment according to the present disclosure.

Figure 1A:
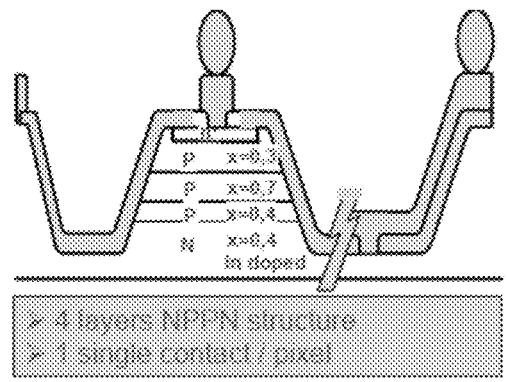
FIGS. 1a-b depict a detector known in the art.
Figure 1B:
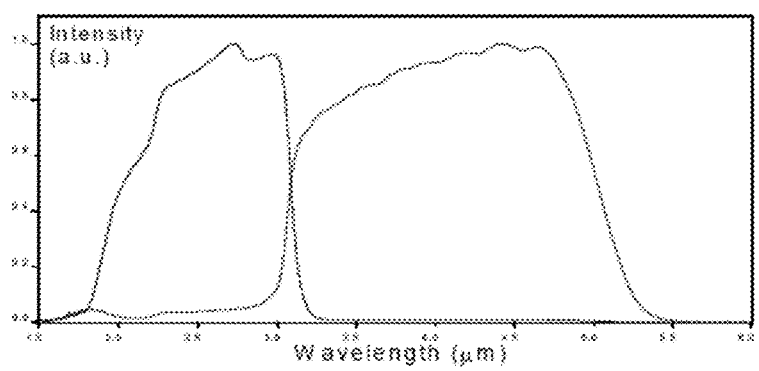
Figure 2A:
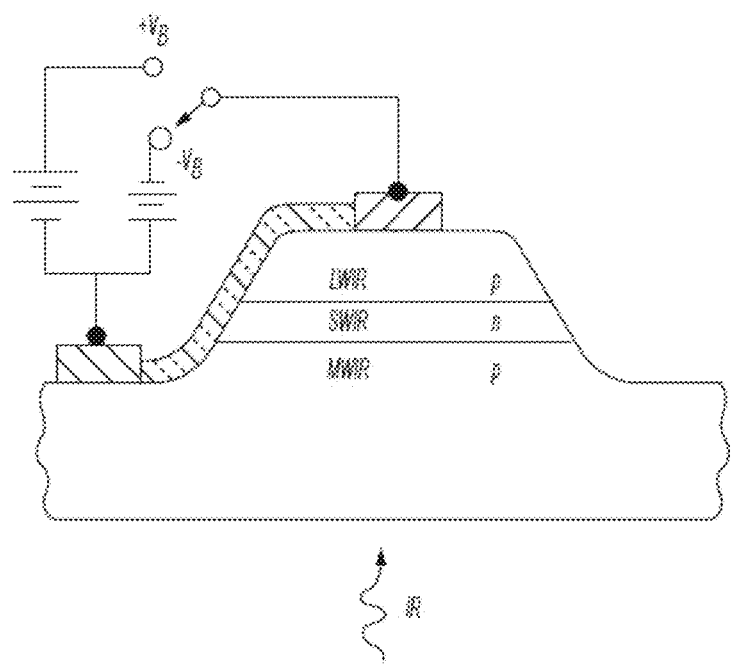
FIGS. 2a-b depict another detector known in the art.
Figure 2B:
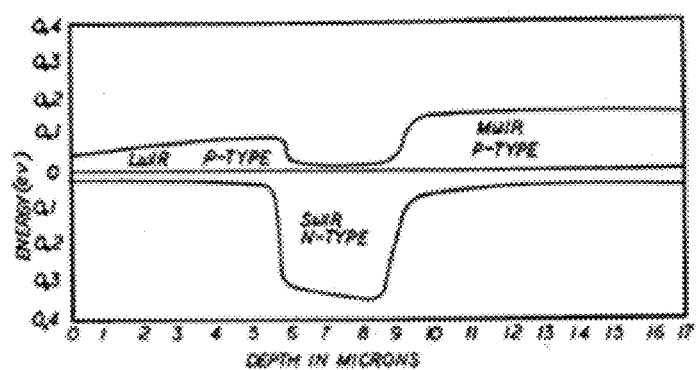
Figure 3A:
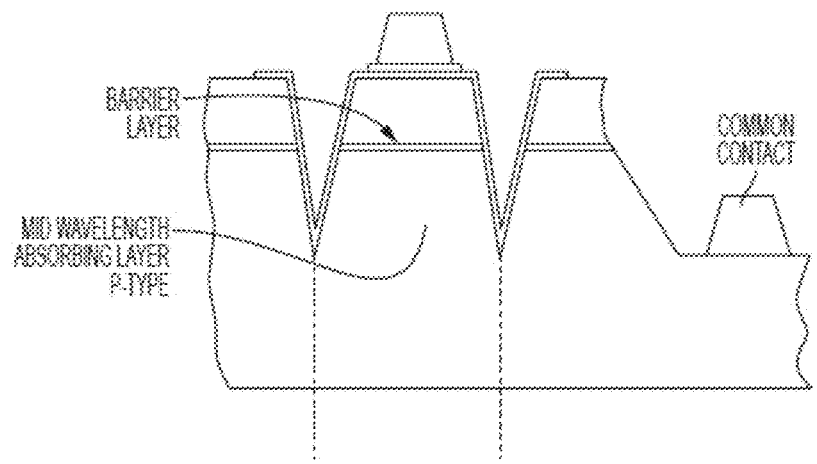
FIGS. 3a-b depict another a detector known in the art.
Figure 3B:
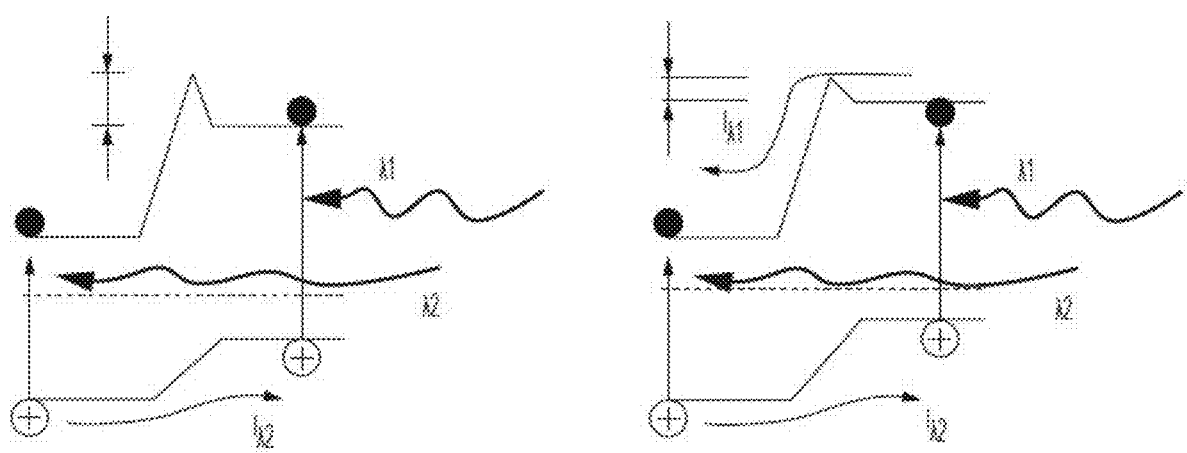
Figure 4A:
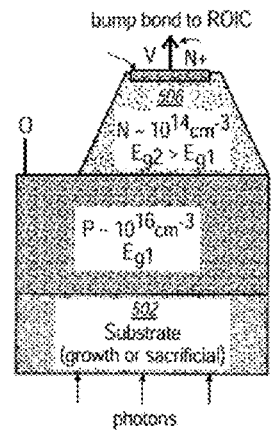
FIGS. 4a-b depict another a detector known in the art.
Figure 4B:
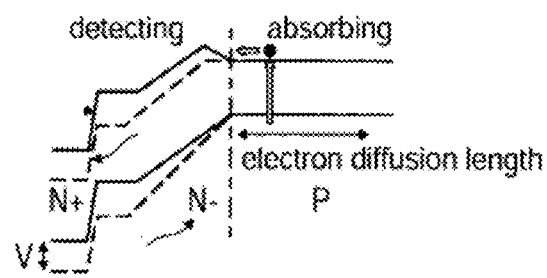
Figure 5:
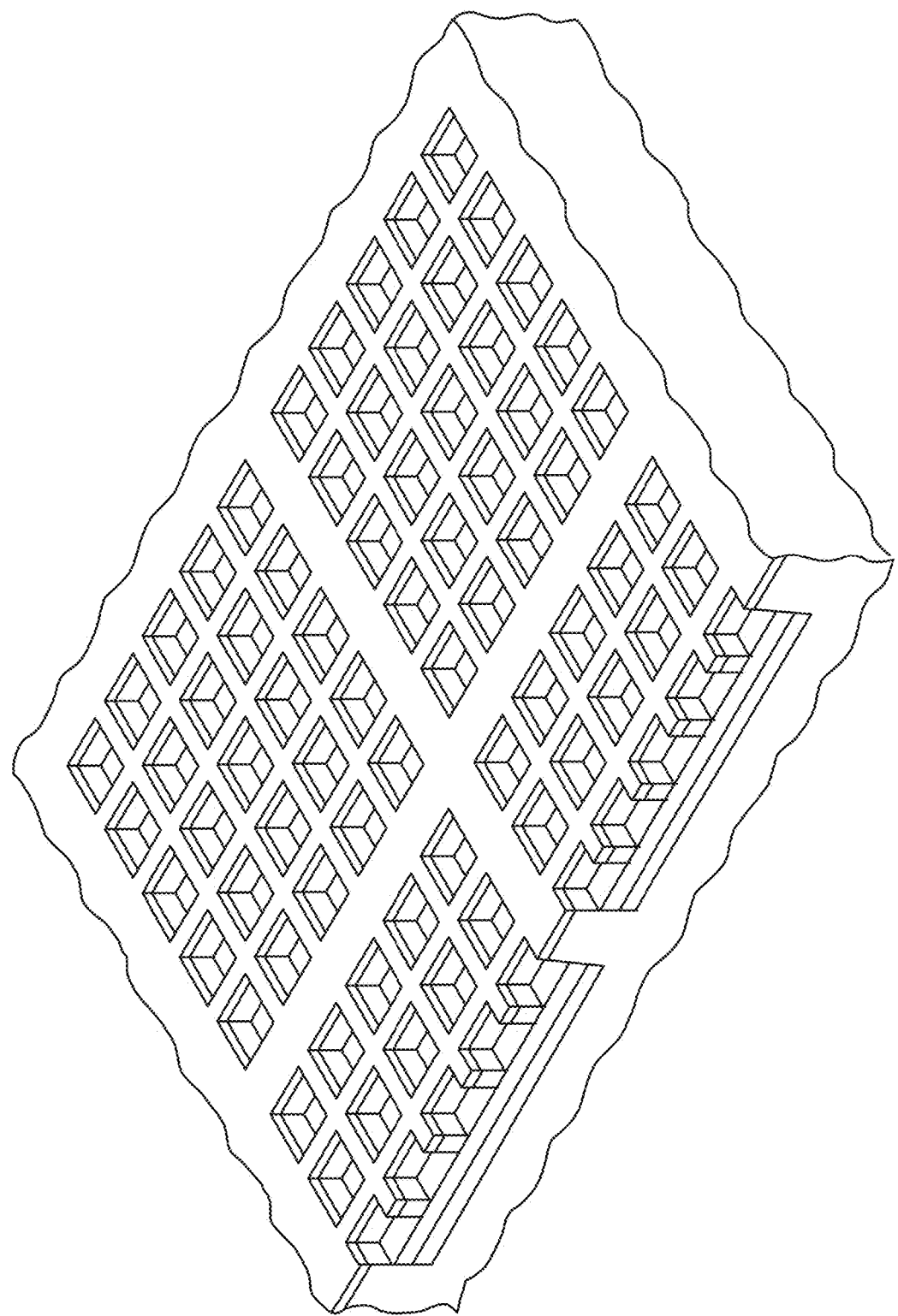
FIG. 5 depicts another a detector known in the art.
Figure 6B:
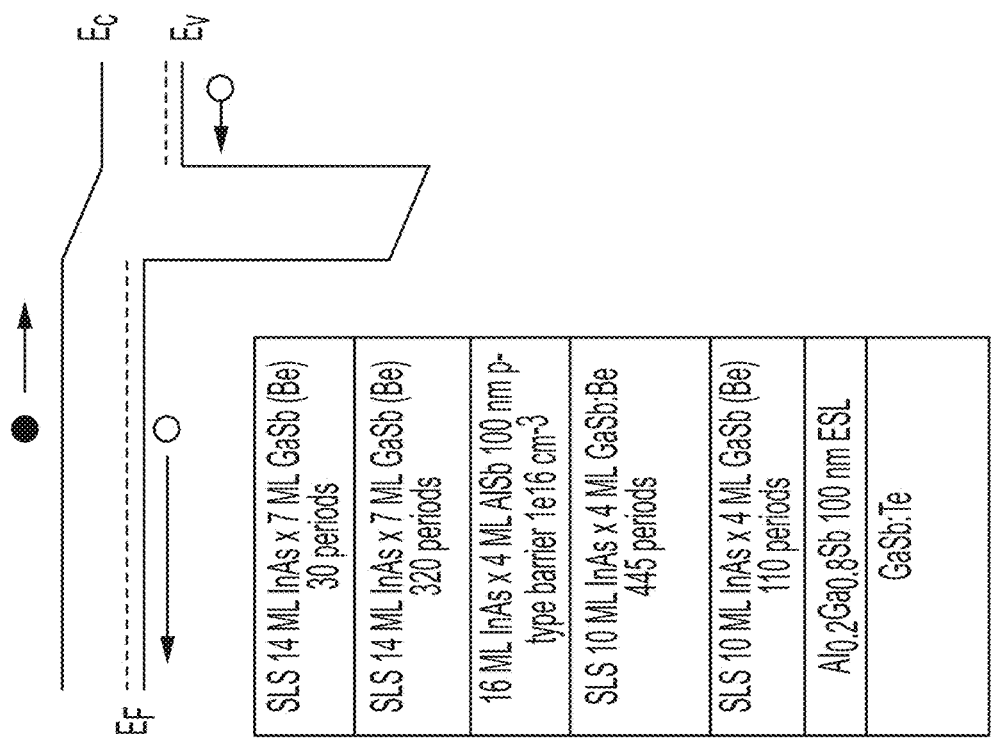
FIGS. 6a-b depict another a detector known in the art.
Figure 6A:
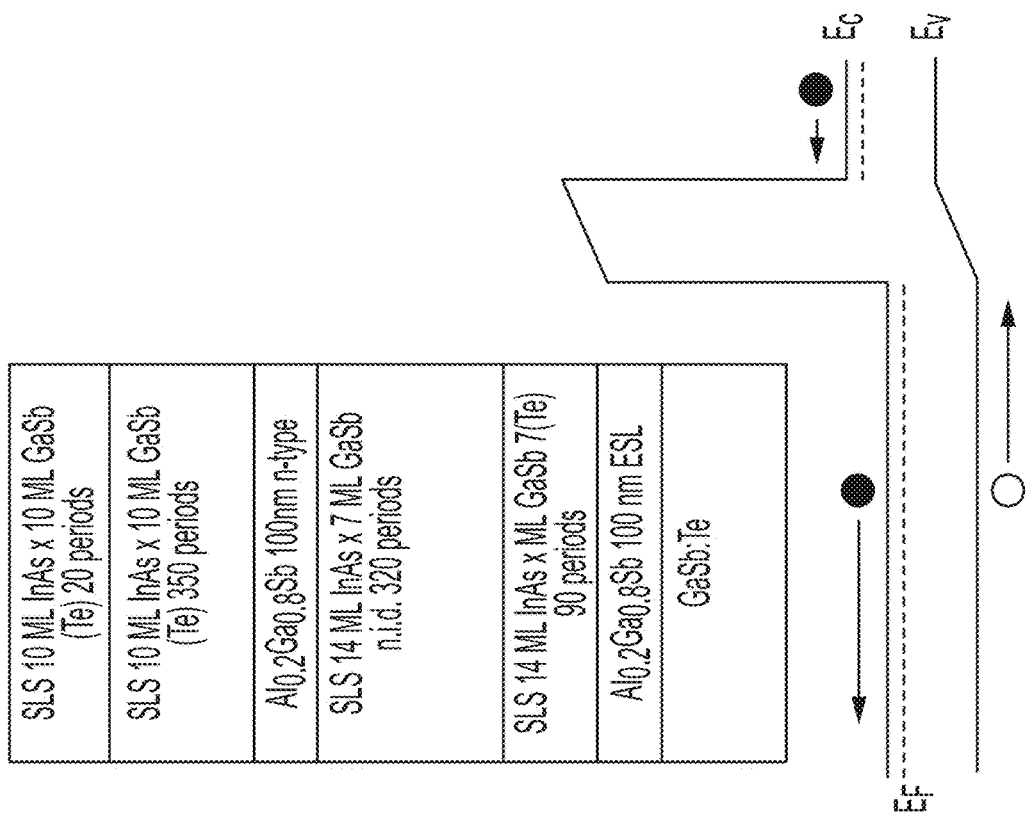
Figure 7:
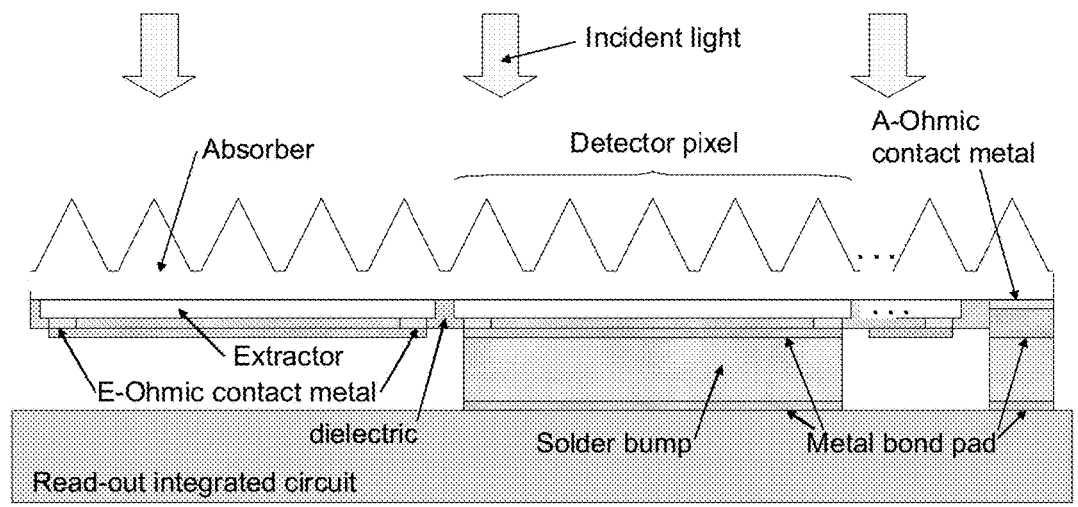
FIG. 7 depicts another a detector known in the art.
Figure 8:
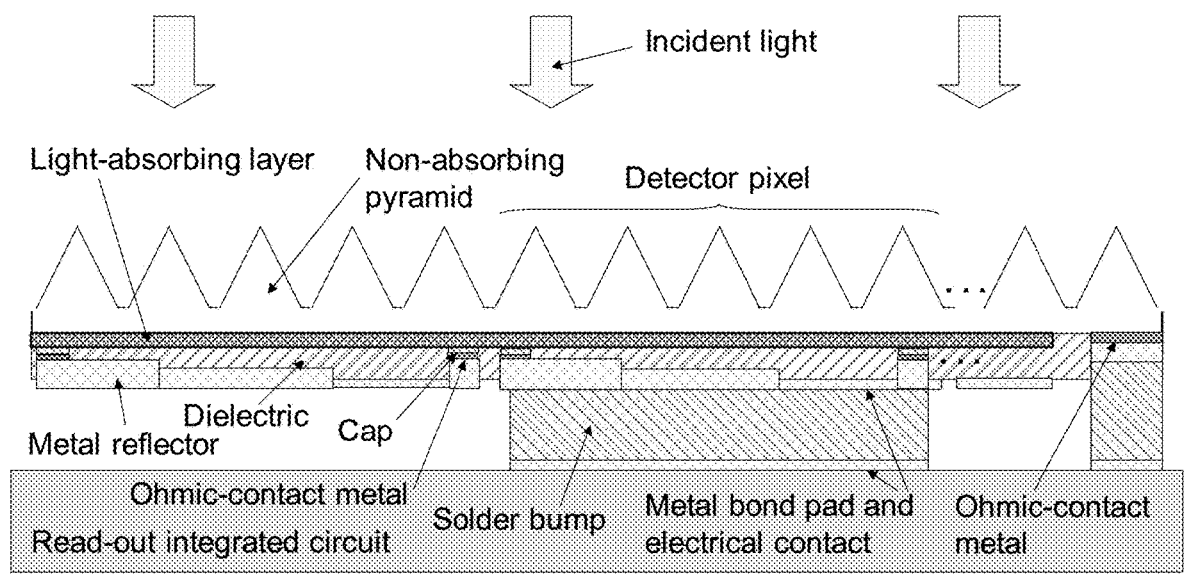
FIG. 8 depicts another a detector known in the art.
Figure 9:
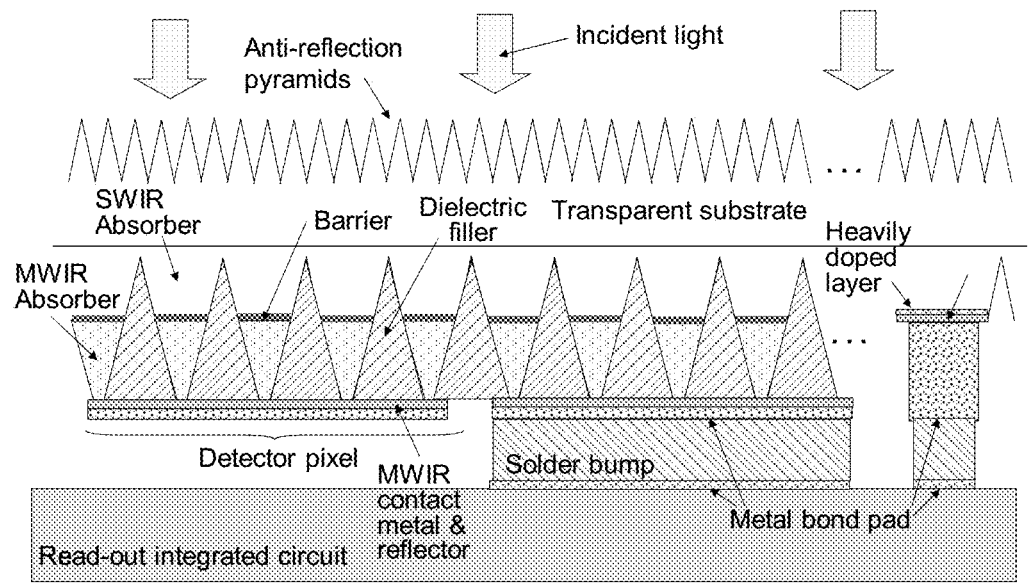
FIG. 9 depicts another a detector known in the art.

In the following description, like reference numbers are used to identify like elements. Furthermore, the drawings are intended to illustrate major features of exemplary embodiments in a diagrammatic manner. The drawings are not intended to depict every feature of every implementation nor relative dimensions of the depicted elements, and are not drawn to scale.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

The presently disclosed embodiments may be applied to a photo-detector array for a switched, dual-band mid-wave infrared (MWIR) focal-plane array imager. The photo-detectors of this array may have a reduced volume of the light-absorbing materials for both wavelength bands. This reduced absorber volume may be achieved with a structure that does not contain any etched mesas whose sidewalls expose any carrier depleted junctions in the semiconductor absorber material.

In some embodiments, the detectors of the presently disclosed detector arrays comprise pyramid-shaped features located on the side of the detectors facing the incident light and metal contacts that also serve as optical reflectors. A first layer of light-absorbing material to absorb light in a first wavelength band and a second layer of light-absorbing material to absorb light in a second wavelength band are located between the pyramid-shaped features and the optical reflector. An electronic barrier structure is located between the first light-absorbing layer and the second light-absorbing layer. This barrier blocks the flow of photo-generated majority carriers and permits the flow of photo-generated minority carriers between the first and second light-absorbing layers. The barrier is designed to not produce any depletion regions in the light-absorbing layers. Each detector also has a heavily doped contact region (or regions) that are located between the second layer of light-absorbing material and the metal contact. In some embodiments, the contact region has a grid-like pattern and a dielectric spacer fills the voids in the grid. In other embodiments, the contact regions comprise a set of small spots surrounded by a dielectric spacer, with each spot located beneath the center of a pyramid-shaped feature. The combination of the pyramid-shaped features, the patterned contact region, the regions of dielectric spacer and the metal reflector acts to increase the absorption of light in the first and second light-absorbing layers.

The first light-absorbing layer may be located between side of the photo-detector array that faces the incident light and the second light-absorbing layer. Thus, the incident light to be absorbed by the second light-absorbing layer must first pass through the first light-absorbing layer. The absorption cutoff wavelength of the first light-absorbing material sets the long-wavelength edge of the first wavelength band. The absorption cutoff wavelength of the second light-absorbing material sets the long-wavelength edge of the second wavelength band. The first light-absorbing layer has an equivalent thickness that is smaller than 1½ times the longest wavelength of the light in the first band and could be as small as this wavelength. The second light-absorbing layer has an equivalent thickness that is smaller than one-half the longest wavelength of the light in the second band and could even be smaller than one-fourth this wavelength. In some embodiments, the first light-absorbing layer is comprised of InAs or InAsSb and the second light-absorbing layer is comprised of a different InAsSb material that is not lattice matched to the material of the first light-absorbing layer. In some embodiments, the pyramid-shaped features are absorbing and are made from the same material as the first light-absorbing layer. Those absorbing pyramids are an extension of that first light-absorbing layer.

In some embodiments, each detector of the detector array presently disclosed has one detector-specific electrical output and also shares an array-common electrical output with other detectors of the array. In one embodiment, the detector can be switched to operate in one of two modes. In a first mode, the detector-specific output is a photo-current related to the absorbed light of the first wavelength band. In a second mode, the detector-specific output is a photo-current related primarily to the absorbed light of the second wavelength band. Those two modes are selected by changing the voltage applied to that detector. The detector-specific contact providing that detector-specific output is electrically coupled to the second light-absorbing layer of a detector via the contact region or regions. The common contact providing the array-common output is electrically coupled to the first light-absorbing layer.

In some embodiments, the photo-detectors of the presently disclosed photo-detector array can selectively detect and distinguish between light in two different wavelength bands. When such a photo-detector array is used in an optical imager, the images at those two bands are captured using the same set of photo-detecting pixels. The dual-band detector array makes possible simpler optical imaging systems since the same lens and optical path can be used for the light of both wavelength bands. Also, the readout circuit of each detector pixel can use the same integration capacitor for the photo-currents of both bands, thereby reducing the size and complexity of that circuit.

In some embodiments, the photo-detectors of the presently disclosed photo-detector array have reduced volume of the photon-absorber material because the first and second light-absorbing layers are thin and also the first light-absorbing layer may have areas in which the light-absorbing material was removed, thereby further reducing its volume. Thus, the photo-detectors can achieve reduced dark current (and improved noise performance) at temperatures higher than typical cryogenic temperatures (e.g., at temperatures of 130-200 K, depending on the cut-off wavelength of its light-absorbing materials).

Despite their reduced absorber volume, the presently disclosed detectors have high absorption efficiency, with an absorbance that exceeds 0.9 for the shorter wavelength light (of the first wavelength band). For some designs of these detectors, the absorbance for the longer-wavelength light (of the second wavelength band) can be greater than 0.7 for all wavelengths within that band and greater than 0.8 for some wavelengths within that band. In addition, several designs are presently disclosed for detectors for which the amount of light of the first wavelength band that is absorbed by the second light-absorbing layer is minimized. For these designs, the crosstalk resulting from absorption of light in the first (shorter) wavelength band by the second light-absorbing layer is less than 5%.

The presently disclosed dual-band detectors, because of the reduced volume of their longer-wavelength light-absorbing material, can operate at much higher temperature while still achieving high sensitivity. The higher operation temperature (>130 K-200 K) made possible by the disclosed invention could greatly reduce the size and cost of the infrared imaging systems since less cryogenic cooling would be needed. The higher temperature operation could reduce the cost of platforms containing such imagers and could improve the reliability of their infrared sensors. The possibility of operating at temperatures achievable with thermo-electric-coolers also increases the breadth of commercial applications since the imagers and detector arrays would be more affordable.

Many high-sensitivity focal-plane photo-detector arrays for detecting light at mid-wave infrared (MWIR) wavelengths or longer need to be cooled to low cryogenic temperatures (e.g., 77 K and lower) in order to sufficiently reduce their internally produced noise current to levels that are below the background noise of the scene. However, cryogenic coolers, such as Stirling coolers, are bulky and they involve moving parts that can reduce the reliability of the overall system. If the operating temperature of the detector array can be increased to 200 K and higher, it approaches the range of temperatures that can be attained by thermoelectric (TE) coolers that do not involve moving parts. If the operating temperature can be increased even to 150 K, it can be cooled by radiative means for imagers used in space. Thus, there is a need for infrared detector arrays that can operate with low noise current at temperatures of 150 K and higher.

The noise current of an un-illuminated infrared detector, or its dark current, has several major components. One component is a generation/recombination current (G/R current) that results from G/R centers at material interfaces such a homojunctions or heterojunctions in the detector. Another component is a diffusion current that, for high quality materials, is limited by thermal generation in the bulk of the light-absorber material. Yet another component is a surface-recombination current due to interface electronic states resulting from un-passivated dangling chemical-bonds at the outer boundaries of the detector semiconductor material. For many common infrared detector materials, such as HgCdTe and antimony-based compounds, the G/R current typically dominates the dark current at low temperatures, such as below 120-150 K. However, at higher temperatures, the diffusion current and the thermal generation within the bulk absorber regions dominate the dark current. This diffusion current is especially significant for the longer-wavelength absorber material, which has a smaller energy bandgap.

One way to reduce the diffusion current at the higher operating temperatures is to reduce the volume of the absorber material. However, this reduction of absorber volume typically also results in a reduction of the photon absorption efficiency and the quantum efficiency of the infrared detector. In some embodiments, the presently disclosed detector achieves both reduced diffusion current as well as high quantum efficiency to permit operation at higher temperatures. The reduced diffusion current is accomplished by reducing the volume of absorber material, for a given input cross-sectional area of detector array or, alternatively, a given pixel area. The high quantum efficiency is achieved by using geometrical features that greatly reduce the net front-side reflection of the incident light and also that trap the incident light such that the light makes multiple passes through the absorber regions.

In a dual-band detector, it is important to have the light of the shorter-wavelength band be absorbed completely in the light-absorbing region for that first band and to avoid having that shorter-wavelength light be absorbed by the material for the second, longer-wavelength band. This minimizes the crosstalk between the detected signals for the two bands. Also, it is desirable to have the absorption spectrum be essentially flat at some maximum value over each of the two bands, to maximize the quantum efficiencies of the detector. Furthermore, it is desirable to minimize the front-side reflection of the detector so that more of the incident light is coupled into the light-absorbing regions rather than being reflected from the structure.

Figure 10:
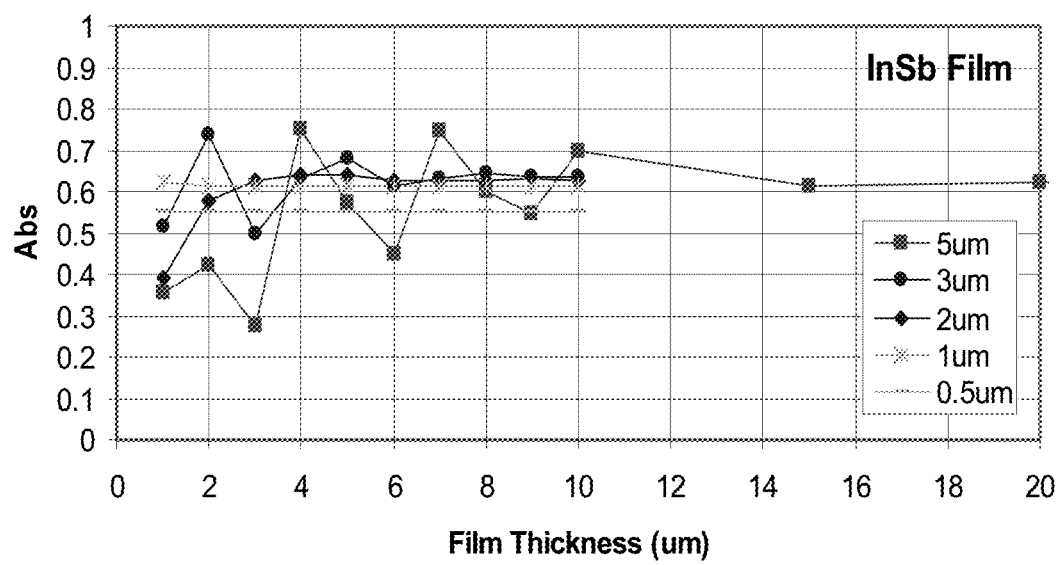
FIG. 10 depicts dependence of the absorbance of a uniform-thickness absorbing layer on the layer thickness and the wavelength of the incident light.

FIG. 10 shows results from calculations of the absorbance (normalized absorption) of a detector comprising a uniform thickness of MWIR absorbing material. These calculations assumed an InSb light-absorbing material but the disclosed detector array actually could comprise any light absorbing material that absorbs light at the desired range of wavelengths for its two detection bands. The results indicate that the thickness of the absorbing layer should be at least 1½ times as large as and preferably twice the wavelength of the incident light in order to achieve maximum broadband absorbance. For thinner absorbing layers, there are strong oscillations in the dependence of absorbance on layer thickness that can be associated with multi-pass optical cavity effects (Fabry-Perot cavity resonances). These oscillations arise because the high refractive index of InSb causes the InSb-to-air interface at the front side of the layer to have high reflection. Since it is desirable to reduce the volume of absorber material, a typical prior detector could have a metal reflector located at the side of the detector opposite the incident light. The combination of the metal backside reflector and the reflectance from the front-side of the InSb layer establishes the Fabry-Perot cavity. The results in FIG. 10 also show that the absorbance obtained for very thick layers of absorber approaches a value of approximately 0.6. This low absorbance is due to the front-surface reflection of the light, since the refractive index of the absorber material is much larger than 1. Many prior detectors have anti-reflection (AR) coatings that comprise one or more layers of dielectric films that have the desired combination of film thickness and refractive index to minimize the reflection at specific wavelengths of the incident light. However, it is desirable to have the detector itself provide broadband response over two wide bands and then to use the AR coatings to specify specific, narrower ranges of wavelengths within those two wide bands.

Figure 11:
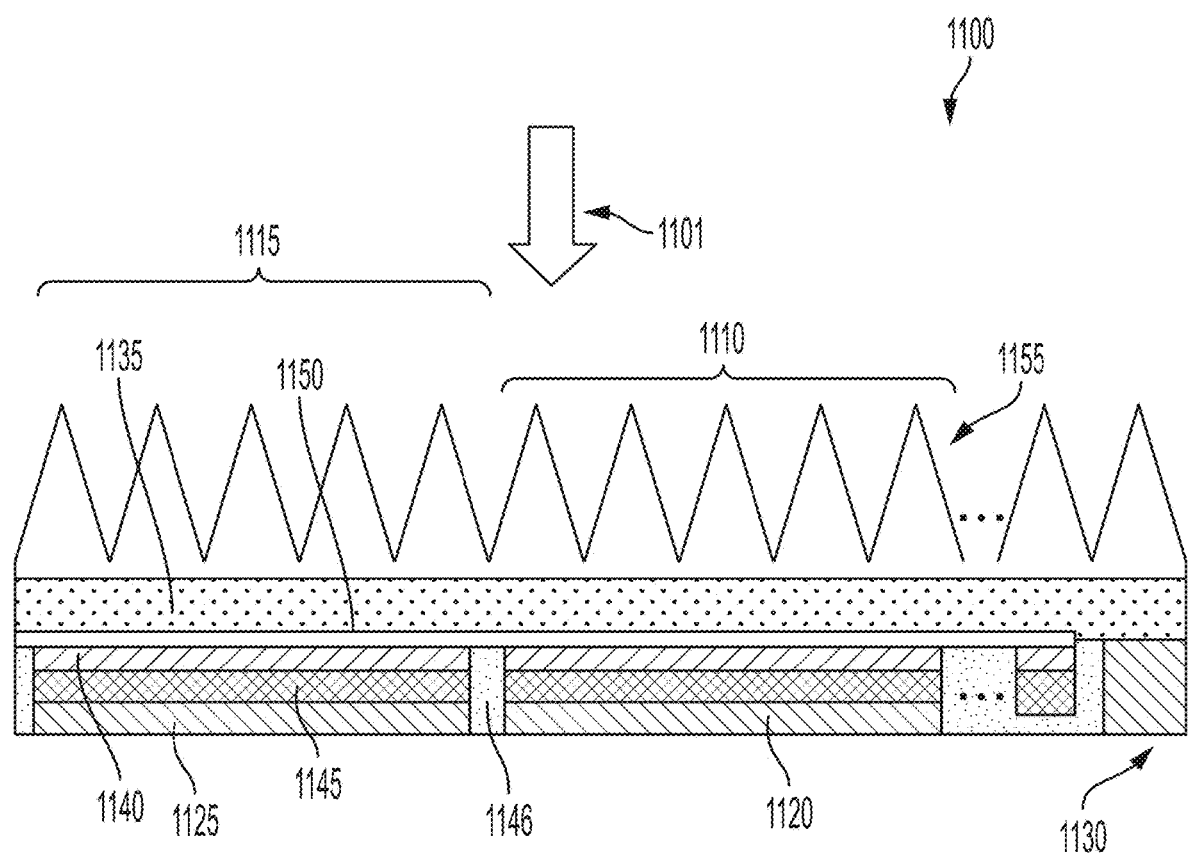
FIG. 11 depicts an embodiment of a detector according to the present disclosure.

In one embodiment, a detector array 1100 according to the present disclosure is shown in FIG. 11. In some embodiments, the detector array 1100 (shown in FIG. 11) absorbs incident light 1101 of MWIR1 and MWIR2 wavelengths. In some embodiments, the detector array 1100 (shown in FIG. 11) absorbs incident light 1101 of short-wave infrared (SWIR) and MWIR wavelengths.

In some embodiments, the detector array 1100 comprises at least two detector pixels 1110 and 1115. In some embodiments, the detector array 1100 further comprises an electrical contact 1120 associated with the detector pixel 1110, an electrical contact 1125 associated with the detector pixel 1110; and an electrical contact 1130 that is common to detector pixels 1110 and 1115.

Figure 12:
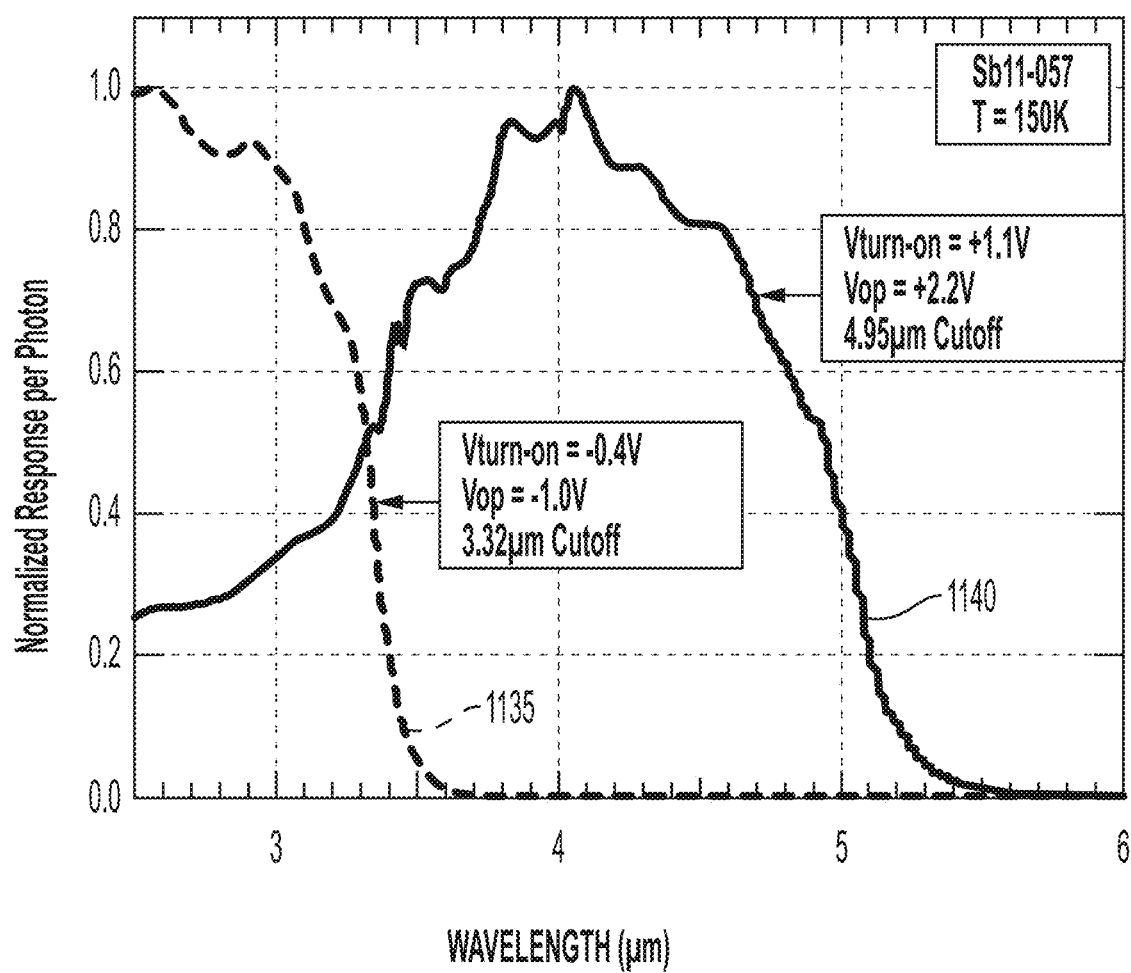
FIG. 12 depicts spectral response characteristic of the detector in FIG. 11.

In some embodiments, the detector array 1100 comprises a first layer 1135 of material that absorbs incident light in the shorter-wavelength band (e.g., MWIR1) and a second layer 1140 of material that absorbs incident light 1101 in the longer-wavelength band (e.g., MWIR2). The specific bands absorbed depend on the cut-off wavelength of the absorption spectra for the light-absorbing materials 1135 and 1140. In one embodiment, the first layer 1135 comprises InAs material with a cut-off wavelength of, for example, 3.3 µm at a temperature of 150 K. In some embodiments, the second layer 1140 comprises an InAsSb material that has a cut-off wavelength of, for example, 4.9 µm at a temperature of 150 K. An example of the spectral characteristic of a dual-band device array 1100 is shown in FIG. 12.

In some embodiments, the first layer 1135 is located closer to the incident light 1101 than the second layer 1140. Thus, the incident light 1101 must first pass through that first layer 1135 before reaching the second layer 1140. The shorter-wavelength components of the incident light 1101 are absorbed, as least in part, before they reach the second layer 1140. However, the longer-wavelength components of the incident light (e.g., wavelengths much longer than, for example, 3.3 µm given exemplary materials presently disclosed) are not absorbed by the first layer 1135 but are transmitted through to the second layer 1140.

In some embodiments, the detector 1100 further comprises a contact layer 1145 (also called a collector) that is located on the side of the second absorber layer 1140 opposite the incident light 1101 (and also opposite the first absorber layer 1135). In some embodiments, the contact layer 1145 comprises material similar to the one used for the second absorber layer 1140, so that it also absorbs the MWIR2 band light. In one embodiment, the material of the contact layer 1145 is heavily doped (e.g., n-type, like the second absorber layer 1140) to facilitate the fabrication of low-resistance ohmic contacts. In some embodiments, the detector 1100 further comprises a low-refractive-index non-absorbing dielectric layer 1146 (such as, for example, a layer of silicon dioxide or polymer) added between portions of the band-2 absorber layer 1140 and the metal backside reflector 1120, 1125. In some embodiments, the dielectric layer 1146 is about 0.3 µm thick.

In some embodiments, the dielectric layer 1146 reduces the absorption of the incident light 1101 by the metal 1120, 1125. In some embodiments, the contact layer 1145 and the dielectric layer 1146 provide different phase shifts to the light reflected from the metal reflector 1120, 1125.

In some embodiments, the pixel-specific electrical output is obtained via the electrical contact made to the contact layer 1145 for that pixel. In some embodiments, the metal pad 1120, 1125 is electrically coupled with an electrical bond (such as a solder bump) that mates with a corresponding bond located on a readout circuit. In some embodiments, the metal pad 1120, 1125 reflects any un-absorbed light back toward the absorbing layers of the detector 1100.

In some embodiments, the electrical contact 1130 is electrically coupled with the first absorber layer 1135. The electrical contact 1130 is shared among multiple pixels 1110, 1115 of the detector array 1100 and provides an electrical output of the detector array 1100. As illustrated in FIG. 11, in some embodiments, the electrical contacts 1120, 1125 and 1130 are accessed from the side of the detector array 1100 opposite the side facing the incident light 1101. Thus both electrical contacts are directly accessible by a read-out integrated circuit (ROIC) that would be located on the backside of the detector array 1100.

In some embodiments, the detector 1100 comprises a carrier-selective barrier 1150 disposed between the first light-absorbing layer 1135 and the second light-absorbing layer 1140. In one embodiment, the light-absorbing layers 1135 and 1140 are lightly doped n-type. In this embodiment, the barrier 1150 is configured to block the flow of electrons, in either direction, between the first light-absorbing layer 1135 and the second light-absorbing layer 1140. The barrier 1150 may be further configured to permit the unimpeded flow of holes, in both directions, between the first light absorbing layer 1135 and the second light-absorbing layer 1140. The direction of net current flow depends on the sign of the voltage applied across the detector array 1100.

In some embodiments, a positive voltage applied to the detector array 1100, with the voltage reference point being the common contact 1130 of the array, extracts the photo-current from the longer-wavelength band. When a positive voltage is applied, the electrons generated in the second absorber layer 1140 flow toward the contact region and are collected at the pixel-specific contact 1120, 1125. The holes generated in the absorber layer 1140 flow through the first absorber layer 1135 to the common contact 1130. However, both the holes and electrons generated in the first absorber layer 1135 flow to the common contact 1130 and there is no net photo-current for the shorter-wavelength band.

In some embodiments, a negative voltage applied to the detector array 1100 extracts the photo-current from the shorter-wavelength band. When a negative voltage is applied, the electrons generated in the first absorber layer 1135 flow toward the common contact 1130 and are collected. The holes generated in the absorber layer 1135 flow across the barrier 1150 and through the first absorber layer 1135 to be collected at the pixel-specific contact 1120, 1125. In this embodiment, both the holes and electrons generated in the second absorber layer 1140 flow to the pixel-specific contact and there is no net photo-current for the longer-wavelength band. To facilitate the collection of the hole or electron currents through the contact region, the interface between the second absorber layer 1140 and the contact layer 1145 may be graded to remove any barrier that may impede the flow of the holes or the electrons.

Figure 13:
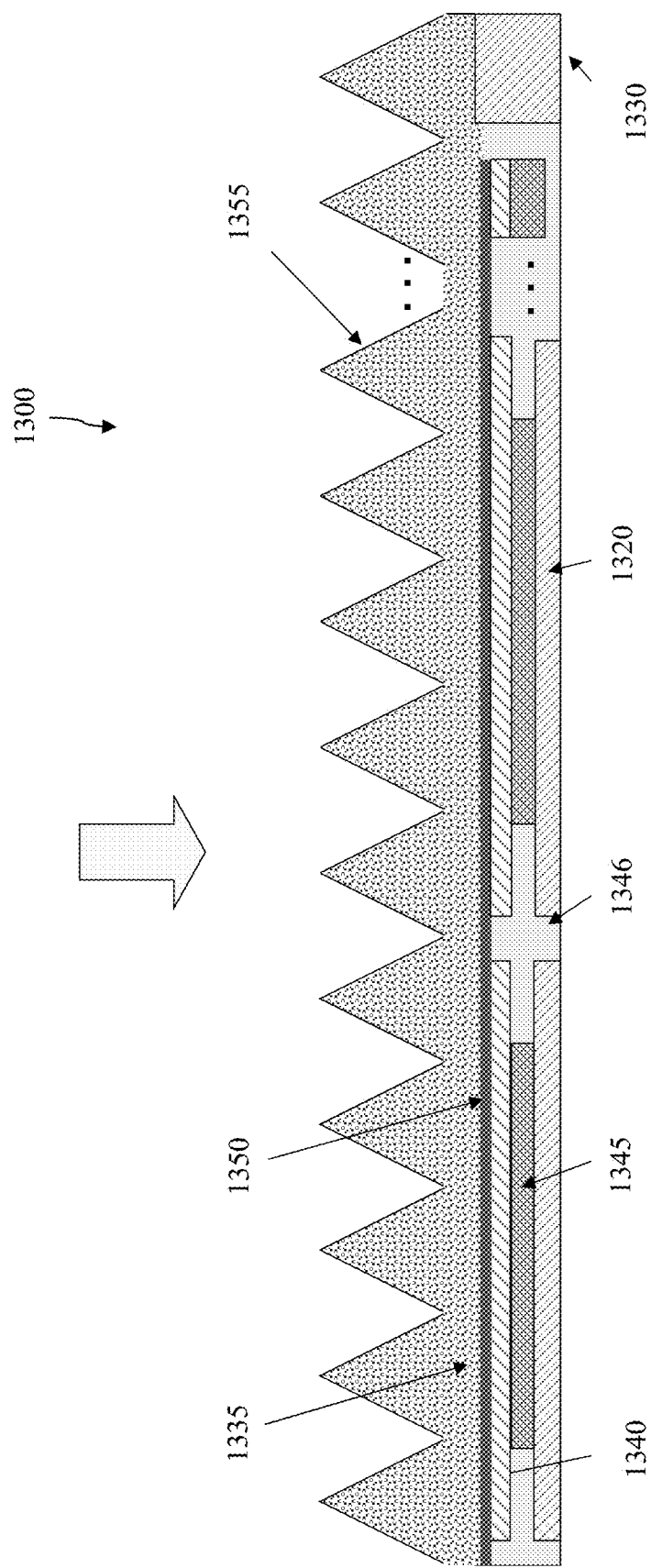
FIG. 13 depicts another embodiment of a detector according to the present disclosure.

In some embodiments, the detector array 1100 comprises pyramid-shaped features 1155 made from a material that has a wider bandgap than the bandgap of the first absorber layer 1135 and the second absorber layer 1140 as depicted in FIG. 11. Thus, the incident light 1101 to be detected by the dual-band detector array 1100 is transmitted through the pyramid-shaped features 1155 without being absorbed by that pyramid material. In an embodiment, the pyramid-shaped features 1155 comprise the same material as the first absorbing layer 1135 as depicted in FIG. 13. In this embodiment, the pyramid-shaped features 1155 also absorb the incident light 1101 of the first wavelength band and the pyramid-shaped features 1155 serve as a portion of the detecting structure for that first wavelength band.

A detector 1300 with absorbing pyramids 1355 is illustrated in FIG. 13. In one embodiment, the detector structure 1300 shown in FIG. 13 is obtained by growing a thick layer of the absorber 1335 for the MWIR1 band and etching pyramid-shaped features 1355 into that absorber layer 1335, leaving a laterally continuous region of unetched material. In some embodiments, the detector 1300 also comprises a carrier-selective barrier 1350 disposed between the first light-absorbing layer 1335 and a second light-absorbing layer 1340. In one embodiment, the barrier 1350 is configured to block the flow of electrons, in either direction, between the first light-absorbing layer 1335 and the second light-absorbing layer 1340. The barrier 1350 may be further configured to permit the unimpeded flow of holes, in both directions, between the first light absorbing layer 1335 and the second light-absorbing layer 1340. The direction of net current flow depends on the sign of the voltage applied across the detector array 1300.

In some embodiments, the detector 1300 further comprises a contact layer 1345 (also called a collector) that is located on the side of the second absorber layer 1340 opposite an incident light (and also opposite the first absorber layer 1335). In some embodiments, the contact layer 1345 comprises material similar to the one used for the second absorber layer 1340, so that it also absorbs the MWIR2 band light. In one embodiment, the material of the contact layer 1345 is heavily doped (e.g., n-type, like the second absorber layer 1340) to facilitate the fabrication of low-resistance ohmic contacts.

In some embodiments, the detector array 1300 further comprises an electrical contact 1320 associated with one of the detector pixels in the detector array 1300 and an electrical contact 1330 that is common to a plurality of detector pixels in the detector array 1300. In some embodiments, the metal pad 1320 is electrically coupled with an electrical bond (such as a solder bump) that mates with a corresponding bond located on a readout circuit. In some embodiments, the metal pad 1320 reflects any un-absorbed light back toward the absorbing layers of the detector 1300.

In some embodiments, the electrical contact 1330 is electrically coupled with the first absorber layer 1335. The electrical contact 1330 is shared among multiple pixels of the detector array 1300 and is an electrical output of the detector array 1300. As illustrated in FIG. 13, in some embodiments, the electrical contacts 1320 and 1330 are accessed from the side of the detector array 1300 opposite the side facing the incident light. Thus both electrical contacts are directly accessible by a read-out integrated circuit (ROIC) that would be located on the backside of the detector array 1300.

In some embodiments, the detector 1300 further comprises a low-refractive-index non-absorbing dielectric layer 1346 (such as, for example, a layer of silicon dioxide or polymer) is added between the band-2 absorber layer 1340 and a metal backside reflector. In some embodiments, the dielectric layer 1346 is about 0.3 μm thick.

In some embodiments, the dielectric layer 1346 reduces the absorption of the incident light by the metal backside reflector. In some embodiments, the contact layer 1345 and the dielectric layer 1346 provide different phase shifts to the light reflected from the metal reflector.

A commercially available electromagnetic (EM) simulation tool (HFSS from Ansoft Corporation) was used to investigate the effects of the pyramidal features, the thickness of the MWIR1 (or Band1) absorbing layer 1135, and the presence of the collector layer 1145 on the absorbance of the dual-band detector array 1100. The absorbance is defined as the ratio of the absorbed light at a given wavelength compared to the incident light at that wavelength. Note that the detector structures considered in the simulations all have a totally reflecting metal reflector at their backside, so any light that is not absorbed is reflected back away from the structure.

Figure 14:
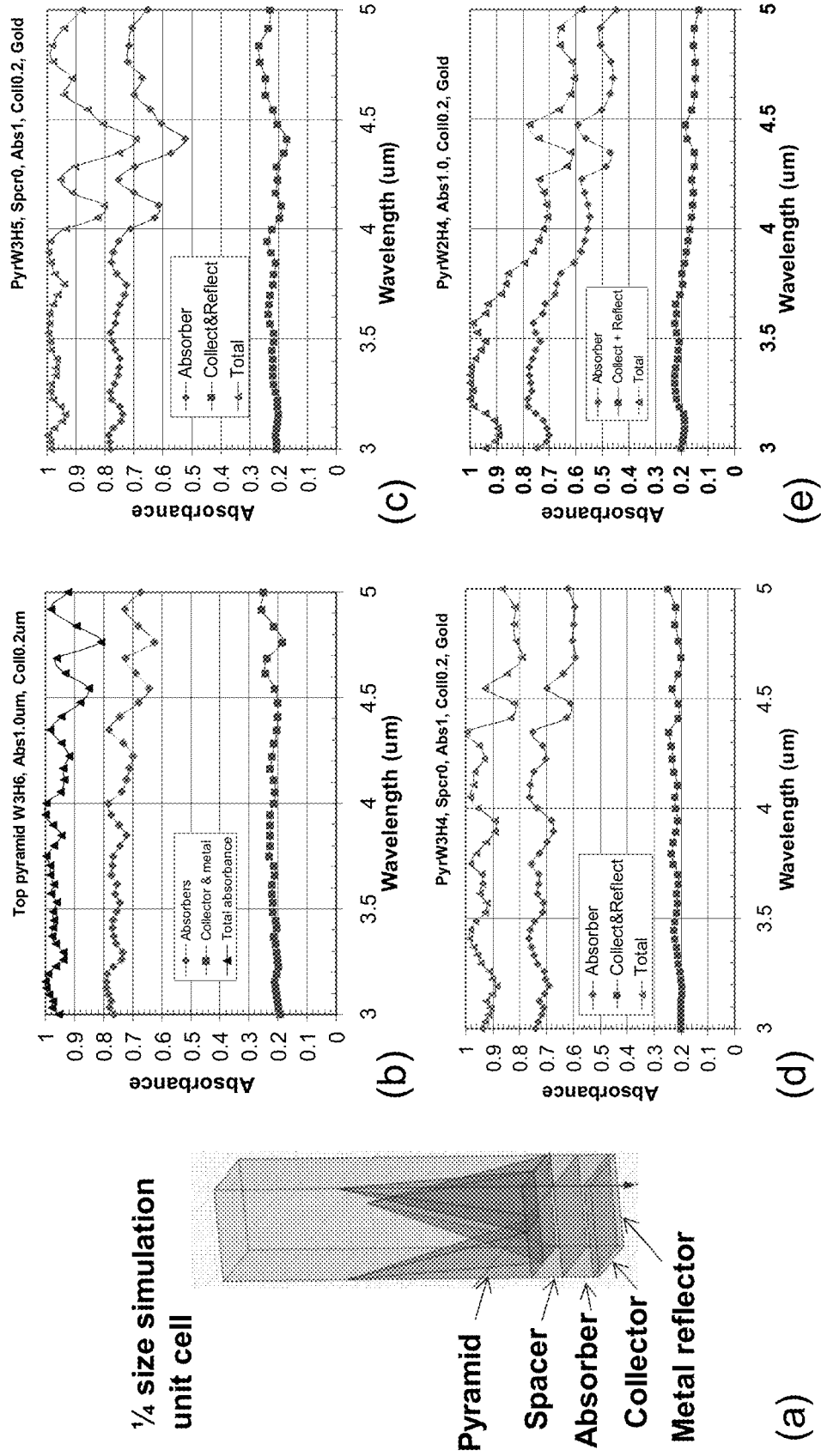
FIGS. 14a-e depict simulation results according to the present disclosure.
Figure 15:
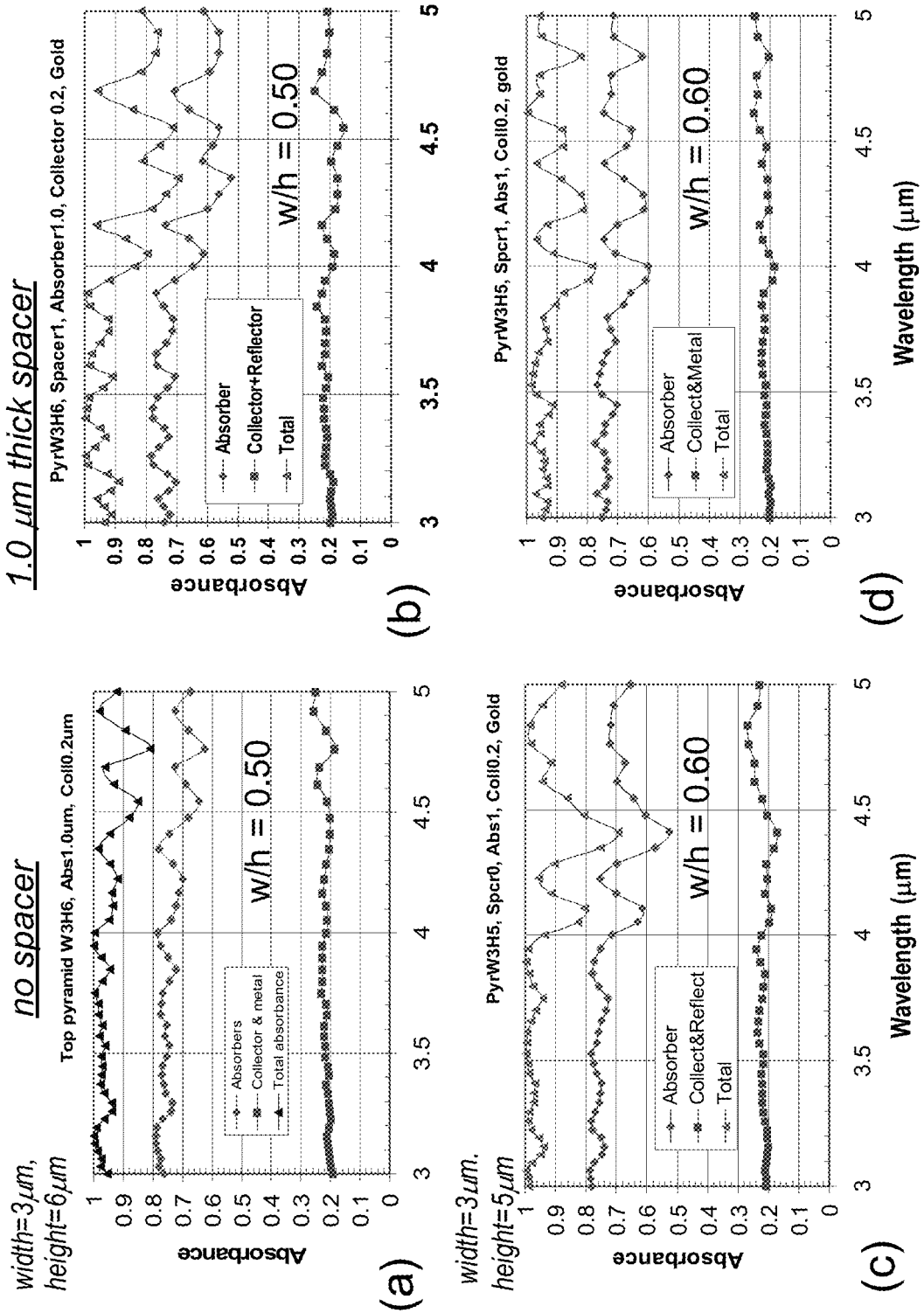
FIGS. 15a-d depict simulation results according to the present disclosure.

FIG. 14a shows an example of the unit cell used in the simulations. Because of the symmetry of the structure, the unit cell contains only portions of several pyramids. In some embodiments, the pyramids are arranged in an offset grid pattern. The centers of the pyramids may be located at the edges of the simulation unit cell The effects of pyramids that are transparent to the light being absorbed are described below. FIGS. 14b-e show the effect of the width and height of the pyramids on the detector array 1100. FIGS. 14b-d show calculated absorbance spectra obtained for structures with pyramid width of 3 or 2 μm and pyramid height of 4 to 6 μm. For these particular simulations, the thickness of the absorbing layer is 1.0 μm and there also is a 0.2 μm thick absorbing collector underneath that absorbing layer. Even though the total thickness of the light-absorbing material is much smaller than the wavelength of the light, more than 90% of that incident light is absorbed, for wavelengths shorter than 4.0 μm. The absorbance is highest when the pyramid width is 3 μm and the pyramid height is at least 5 μm. For narrower pyramids, the absorbance at the longer wavelengths is degraded. Also for the shorter pyramids, the absorbance at the shorter wavelengths is degraded.

FIGS. 15a-d show the effect of the spacing between the pyramids 1155 and the absorber layer, calculated for two different pyramid shapes. The plots in these figure show that the absorbance for the shorter wavelengths (i.e., between 3 and 4 µm) is higher when there is no spacer. Thus, in terms of the absorption characteristics, there is no benefit to intentionally having an additional spacer region between the bottom or base of the pyramids 1155 and the top of the MWIR band 1 absorber layer 1135. Now some spacer region may be unavoidable if one wants to keep from etching the band 1 absorber layer when etching the pyramid shapes. Note that when the band 1 absorber material is covered by the transparent material from which the pyramids are formed, dark current noise due to surface recombination from exposed portions of the band 1 material is avoided. FIGS. 14b-e and 15a-d also show that a substantial percentage of the incident light is not absorbed by the 1 µm thick absorber layer but rather penetrates to the layer underneath. Thus, in some embodiments, the thickness of the first absorber layer is larger than 1 µm.

Figure 16:
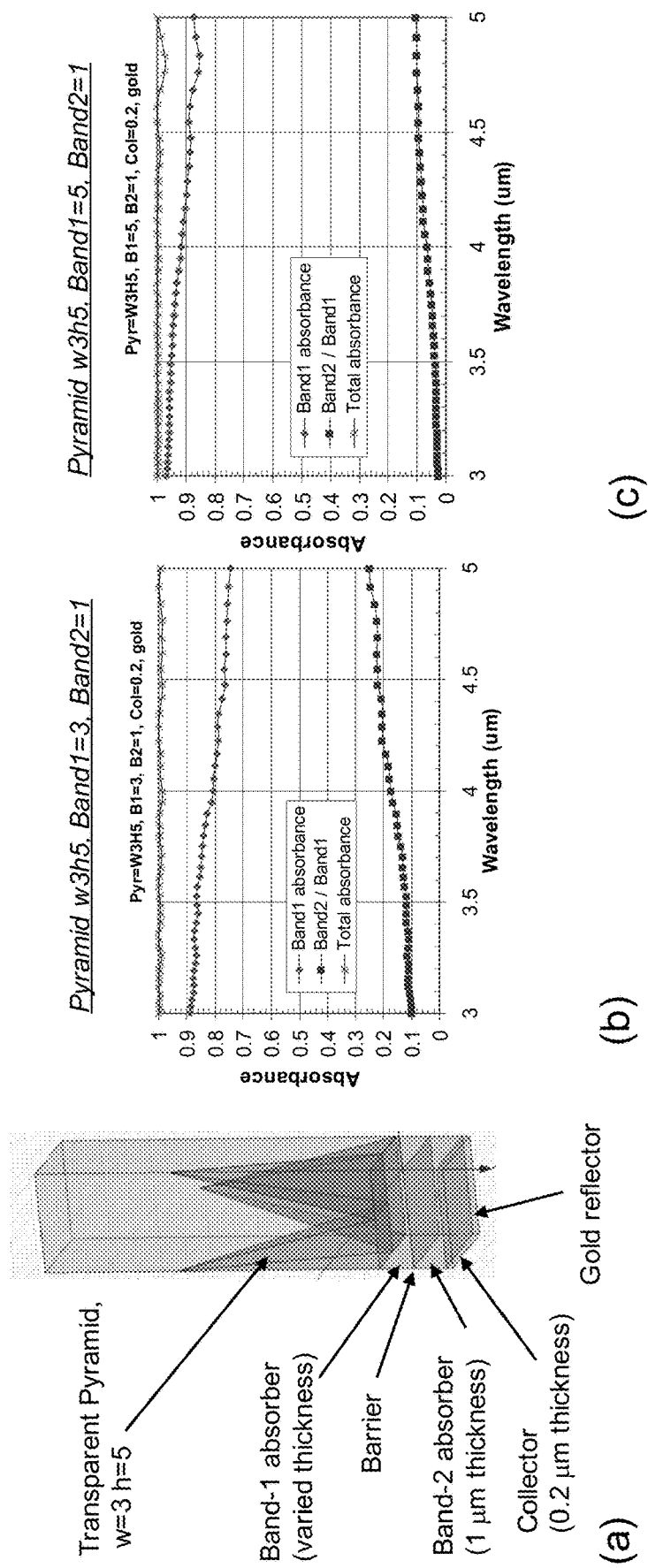
FIGS. 16a-c depict simulation results according to the present disclosure.

FIGS. 16a-c show the effect of the thickness of the band 1 absorber layer on the absorbance spectrum. As expected, higher absorbance may be achieved by a detector with a thicker absorber layer. The pyramids, even though they are transparent, are beneficial because the absorption in the band 1 absorber layer is greater than 0.90 for wavelengths shorter than 4.0 µm and the absorbance in the band 1 layer is greater than 0.95 for wavelengths shorter than 3.5 µm. These values for the thickness of the band 1 absorber in a detector with pyramids are much smaller than the thickness of the MWIR band 1 absorber in prior-art detector structures. For the structures whose absorbance spectra are shown in FIGS. 16a-c, the thickness of the band-1 absorber is 3 or 5 µm and the total thickness of the band-2 absorber plus collector is 1.2 µm.

Figure 17:
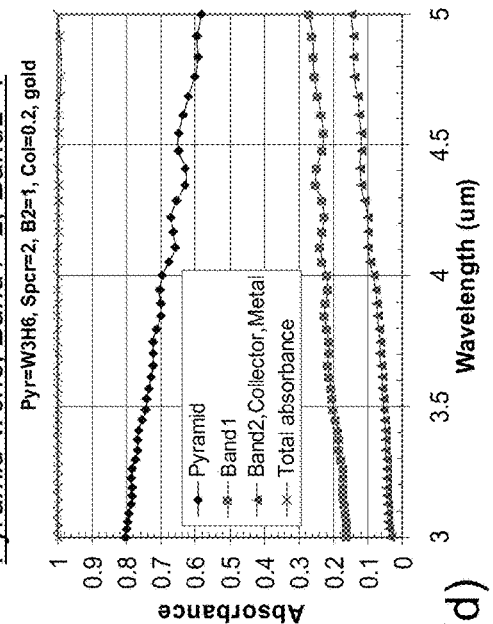
FIGS. 17a-d depict simulation results according to the present disclosure.
Figure 17:
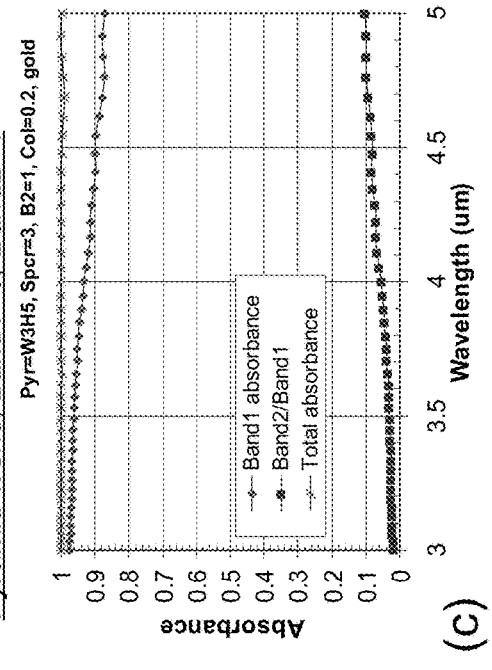
Figure 17:
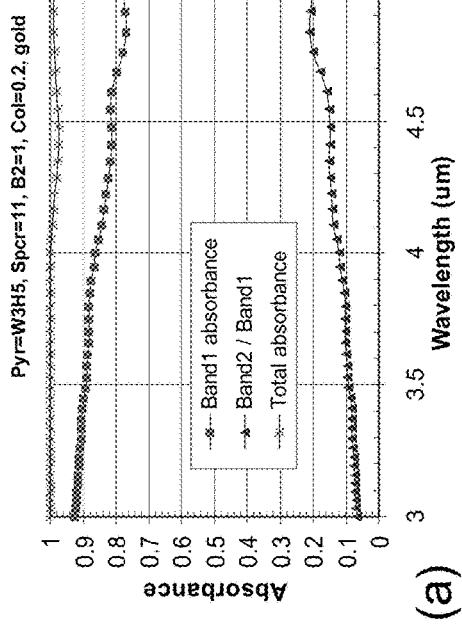
Figure 18:
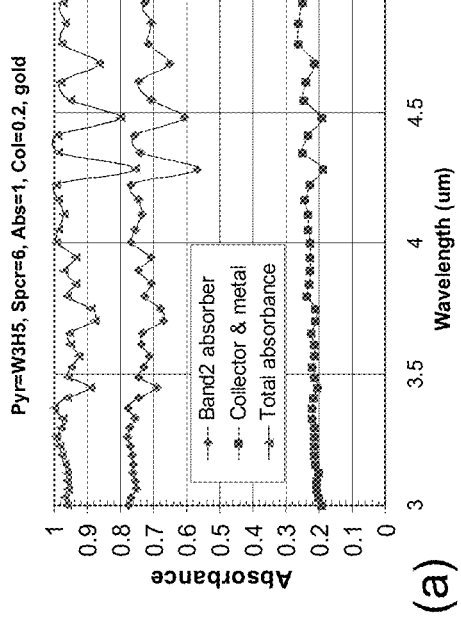
FIGS. 18a-d depict simulation results according to the present disclosure.

FIGS. 17a-c show simulation results for the detector array 1300 shown in FIG. 13. Results are shown for structures that have 6 or 5 µm tall absorbing pyramids above a laterally continuous absorber layer whose thickness is 1, 2 or 3 µm. The absorbance of the structure with 6 µm tall absorbing pyramids above a 2 µm thick laterally continuous absorber layer is similar to the absorbance of the structure with 5 µm tall absorbing pyramids above a 3 µm thick laterally continuous absorber layer. Note that in both of these cases, the total thickness of the band-1 absorber material is 8 µm. Incidentally, an array of pyramids has an equivalent thickness of absorber material, as determined by the equivalent volume of absorber material, that is ⅓ the height of the pyramid. Thus, the equivalent absorber thickness for the structure of FIG. 17b is 4.0 µm and the equivalent absorber thickness for the structure of FIG. 17c is 4.7 µm. By comparing the results shown in FIGS. 17 and 16, it is clear that the pyramids are actually somewhat more efficient absorbers (per unit volume of absorbing material) than the layer underneath it. This may be attributed, at least in part, to the longer interaction length of the normal-incidence-angle light with the absorber material of the taller pyramid compared to the shorter underlying absorbing layer.

FIG. 17d compares the relative amounts of absorption contributed by the absorbing pyramids, the laterally continuous band-1 absorber layer, and the remaining parts of the detector. As shown in FIG. 17d, most of the light is absorbed in the pyramids 1355, especially for the shorter wavelength components of that light. Even for light of 5 µm wavelength, the longest wavelength considered in these simulations, the absorbance of the pyramids is twice as high as the absorbance of the absorbing layer underneath it. The dominance in the absorption in the pyramids over the absorption in the underlying layer occurs even though the equivalent volume of absorber material is the same for both of these portions of the structure.

The height of the pyramids 1355 and the thickness of the band-1 absorber layer 1335 affect the absorbance of the band-2 light by the second absorber layer. This happens even though the pyramids 1355 and band-1 absorber layer 1335 are transparent to the band-2 light.

FIGS. 18a-d shows results for the band-2 absorbance calculated for a structure with transparent pyramids and band-1 absorber layer. For this structure, the thickness of the laterally continuous band-2 absorber layer is only 1 µm. Despite having such a thin absorber, the absorbance attributed to this layer is generally greater than 0.6 and can be as high as 0.75, for wavelengths of the incident light between 4 and 5 µm. The exception is the structure whose band-1 absorber layer is 5 µm thick, which shows somewhat lower absorbance for those wavelengths between 4.65 and 5.0 mm. However, the structure with a slightly thicker band-1 absorber (whose thickness is 6 µm) again has absorbance of at least 0.6. As shown in FIGS. 18a-d, the specific spacing between the pyramids and a thin light-absorbing layer, as well as from the metal reflector at the bottom of the structure, does have some effect on the absorbance characteristics of the detector. The results suggest that it is better to keep the thickness of the band-1 absorber layer under the pyramids fairly small—a thickness of 1-3 µm is preferred to a thickness of 5-6 µm. For these structures, more than 20% of the incident light is absorbed by the collector layer underneath the second absorber layer and by the metal reflector (which also serves as the contact pad). The absorption in the metal does not contribute to the output photo-current signal and much of the photo-current from absorption in the contact layer also does not contribute to the output signal. Thus, it is desirable to reduce that parasitic absorption.

Figure 19:
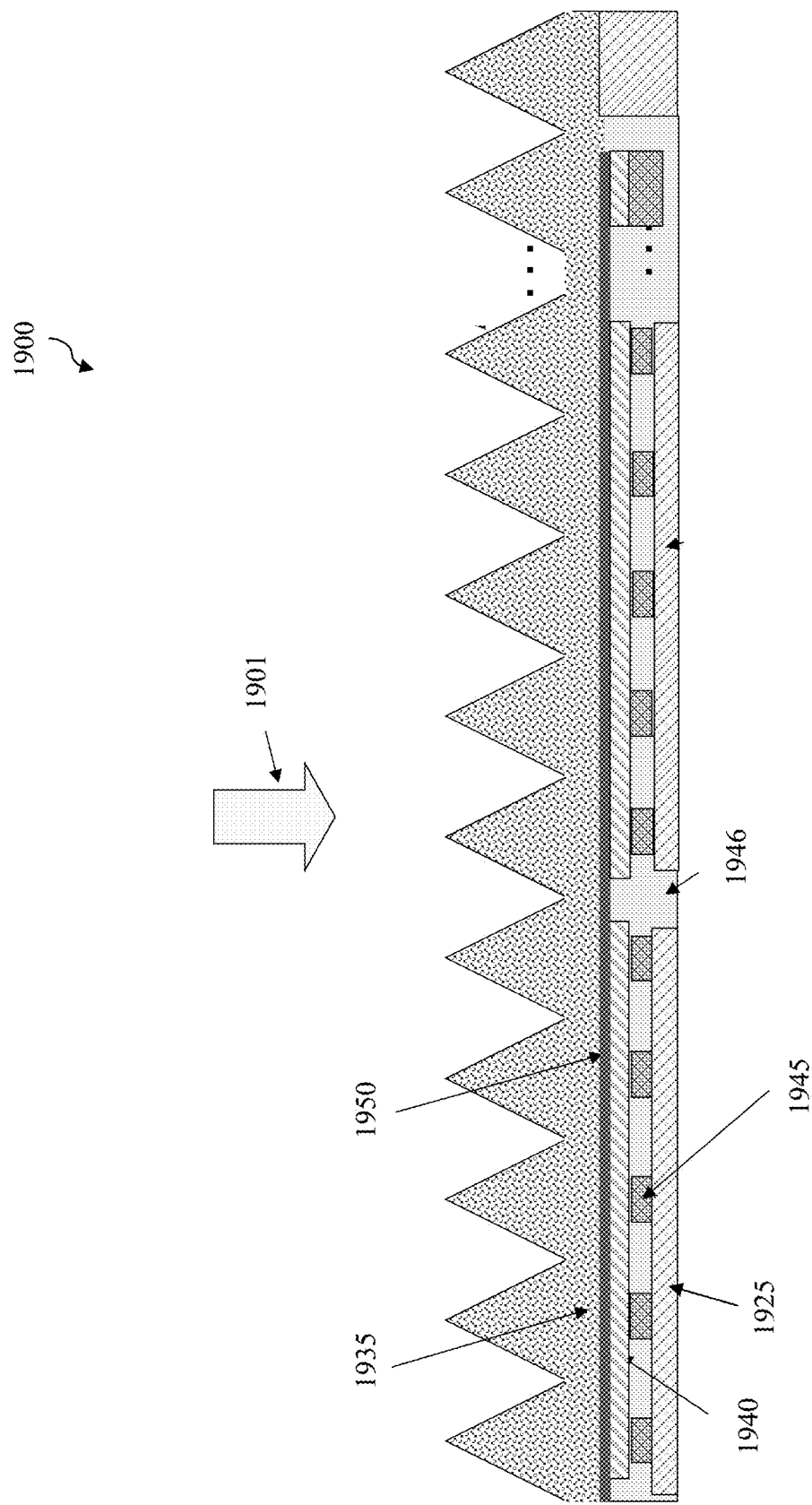
FIG. 19 depicts another embodiment of a detector according to the present disclosure.

Referring to FIG. 19, detector array 1900 reduces parasitic absorption by reducing the volume of the contact region 1945 in the detector array 1900. In one embodiment, a low-refractive-index non-absorbing dielectric layer 1946 (such as, for example, a layer of silicon dioxide or polymer) is added between the band-2 absorber layer 1940 and the metal backside reflector 1925. In some embodiments, the dielectric layer 1946 is about 0.3 µm thick.

In some embodiments, the dielectric layer 1946 reduces the absorption of the incident light 1901 by the metal 1925. In some embodiments, the contact layer 1945 and the dielectric layer 1946 provide different phase shifts to the light reflected from the metal reflector 1925. This may reduce the depth of the dips in the absorbance spectrum, giving a net absorption spectrum whose absorbance value at each wavelength is closer to the average of the values for the peaks and dips seen in the spectra shown in FIGS. 18a-d. In one embodiment, the detector structure 1900 shown in FIG. 19 is obtained by growing a thick layer of the absorber 1935 for the MWIR1 band and etching pyramid-shaped features into that absorber layer 1935, leaving a laterally continuous region of unetched material. In some embodiments, the detector 1900 also comprises a carrier-selective barrier 1950 disposed between the first light-absorbing layer 1935 and a second light-absorbing layer 1940. In one embodiment, the barrier 1950 is configured to block the flow of electrons, in either direction, between the first light-absorbing layer 1935 and the second light-absorbing layer 1940. The barrier 1950 may be further configured to permit the unimpeded flow of holes, in both directions, between the first light absorbing layer 1935 and the second light-absorbing layer 1940. The direction of net current flow depends on the sign of the voltage applied across the detector array 1900.

Figures 20A, 20B:
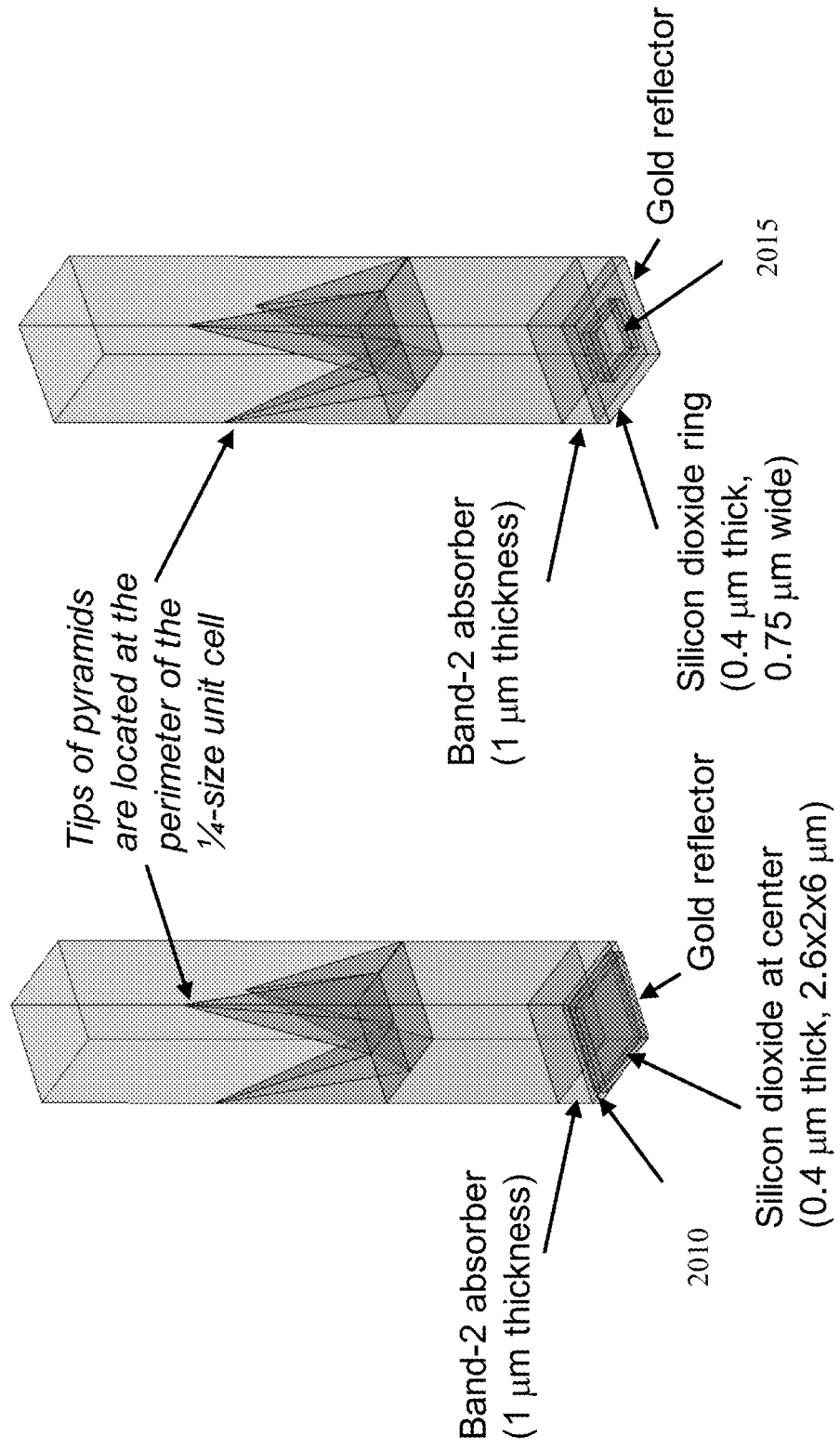
FIGS. 20a-b depict simulation unit cells according to the present disclosure.
Figure 21:
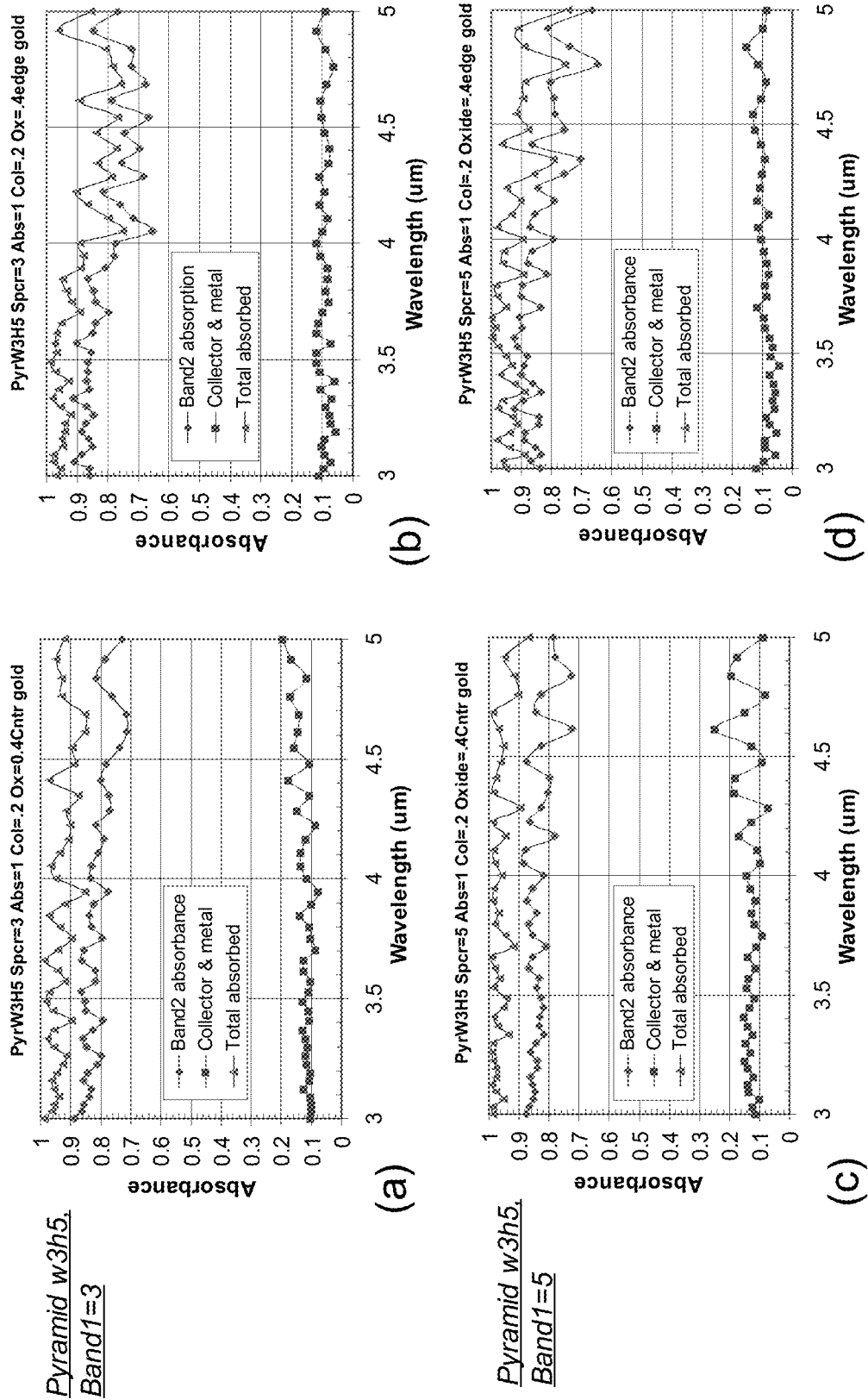
FIGS. 21a-d depict simulation results according to the present disclosure.

In some embodiments, for a detector whose contact regions are absorbing, the specific configuration and placement of those contact regions (i.e. collector regions) can affect the amount of incident light absorbed in the second absorber layer. FIGS. 20*a-b* show two examples of such configurations. In FIG. 20*a*, the collector regions 2010 (shown as a ring) are located underneath the peaks of the pyramids. In FIG. 20*b*, the collector regions 2015 (shown as a square) are located underneath the edges of the pyramid bases. In some embodiments, the ring shaped collector region 2010 are laterally contiguous, forming a waffle-like pattern at the bottom of the detector structure. This continuity permits electrical carriers to flow in the lateral directions. In some embodiments, the square shaped collector regions 2015 are separate from every other collector region. Thus, a metal layer may be needed to electrically connect those separated collector regions.

FIGS. 21*a-d* show one example of the effect of the placement of the collector and oxide regions. For this particular example of band-2 absorber thickness, band-1 absorber thickness, and pyramid dimensions, higher absorbance in the band-2 absorber layer is achieved when the detector has a collector-ring configuration. Note that for the structure with a band-1 absorber thickness of 5 μm, the absorbance for the band-2 layer is now increased to a value greater than 0.7 for all wavelengths considered. Also, the absorbance is greater than 0.80 to 0.85 for some wavelengths. This high absorbance is achieved even though the thickness of the band-2 absorber layer is only 1 μm. The thickness of that band-2 absorber layer is only ¼$^{th}$ the wavelength of the light that is absorber. Such a significant reduction of the volume of absorber material can be accompanied by a reduction in the diffusion component of the detector dark current.

Figure 22A:
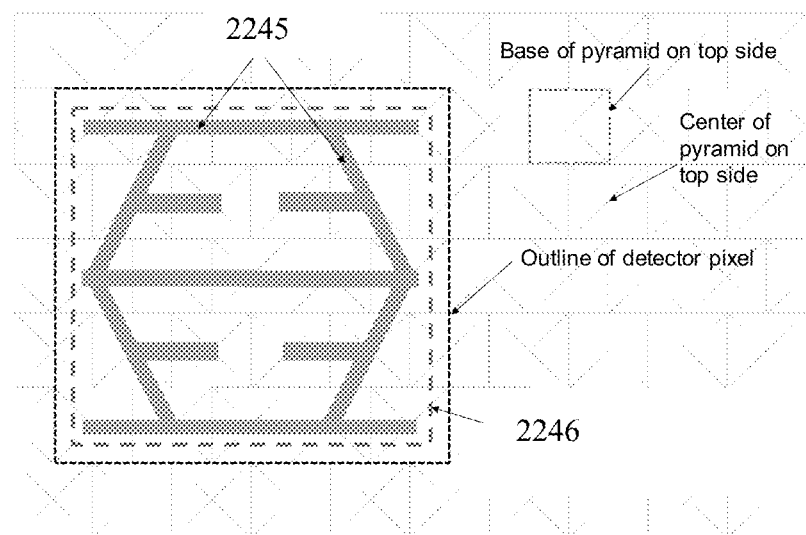
FIGS. 22a-b depict another embodiment according to the present disclosure.
Figure 22B:
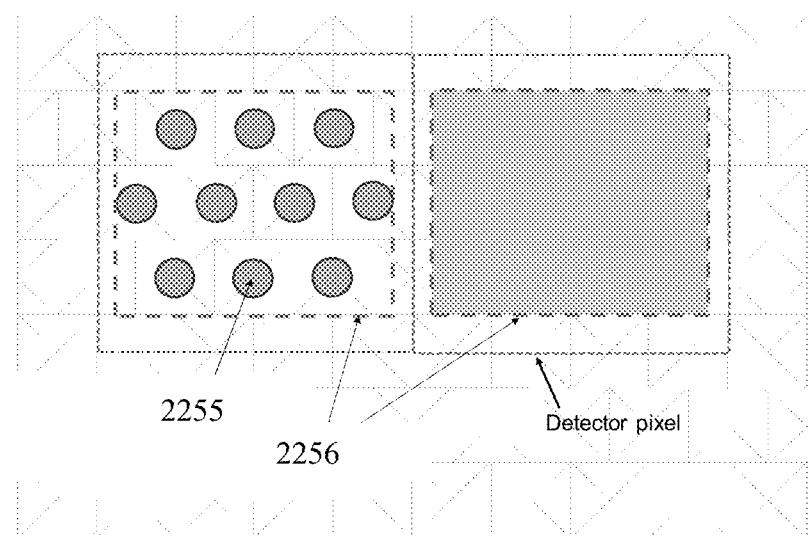

FIGS. 22*a-b* show two other possible arrangements of the contact (or collector) regions as viewed from the backside of a detector array. As shown in FIG. 22*a*, in some embodiments, a contact region 2245 for a given detector pixel is a contiguous structure. In contrast to the contact-region arrangement shown in FIGS. 20*a-b*, the contact regions 2245 are arranged to avoid the corners of the pyramids, where the absorption by the pyramids and by the absorber layers is weakest. The light in those regions is reflected from the metal pad 2246, with the dielectric fill material serving to reduce the unwanted absorption by the metal. This reduced absorption occurs because the optical field intensity at the metal 2246 is reduced since some of that light is essentially partially reflected by the interface between the high-refractive-index absorber layer and the low-refractive-index dielectric material.

Referring to FIG. 22*b*, in some embodiments, the contact regions 2255 are isolated spots that are located under the centers of the various pyramids. These electrically separated collector or contact regions 2255 are then electrically connected together by the metal contact pad 2256, which may also serve as the bond pad for the solder bumps. In some embodiments, the metal pad 2256 serves as an optical reflector at the backside of the detector. In some embodiments, the metal pad 2256 does not extend completely to the edge of a detector pixel, in order to reduce the optical crosstalk between adjacent pixels.

Figure 23B:
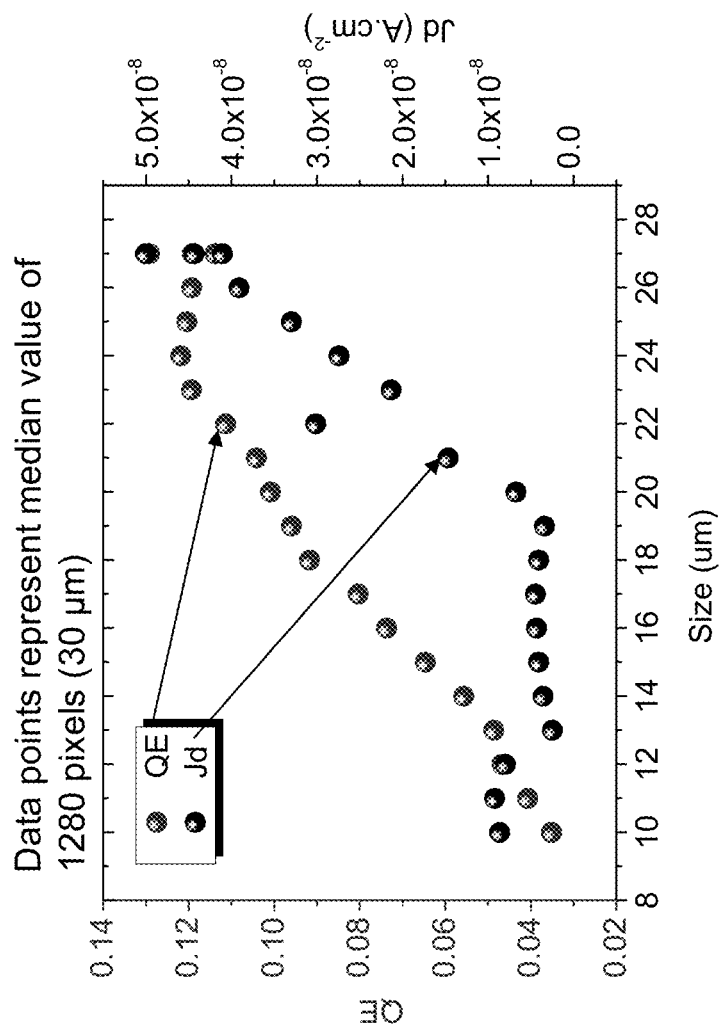
FIGS. 23a-b depict another embodiment according to the present disclosure.
Figure 23A:
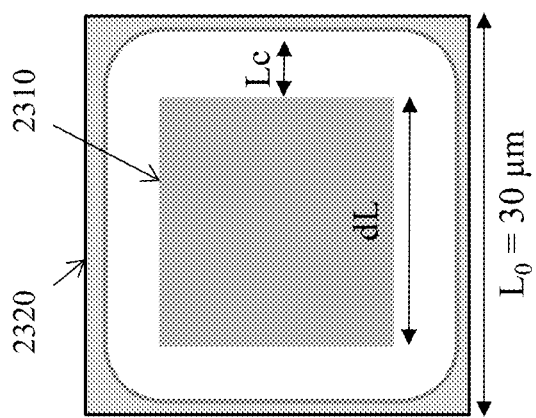

The use of collector or contact regions that do not fully occupy the area of a detector pixel can be done without compromising the quantum efficiency for detection of the band-2 light. FIGS. 23*a-b* show measurements obtained for single-band detector test structures for which the collector area is smaller than the overall pixel area. In this embodiment, there is a single collector region 2310 in each detector pixel 2320 and those pixels actually do not have pyramids on the front side. These results show that the edge of the collector region 2310 may be about 3 μm away from the edge of the detector pixel 2320 before there is any noticeable reduction in the quantum efficiency of the detector. When the distance of the collector region 2310 from the edge of the detector pixel 2320 is increased to 5 μm, the quantum efficiency is reduced by about 20%. By having multiple, small collector regions in each pixel while keeping the separation between these collector regions smaller than 6 μm, which is two times the maximum distance between the collector and the edge of the pixel for which no reduction was observed in the quantum efficiency in the experimental data of FIGS. 23*a-b*, it is possible to achieve the improved band-2 absorption predicted in FIG. 22 without sacrificing any reduction in the collection efficiency and quantum efficiency.

Figure 24:
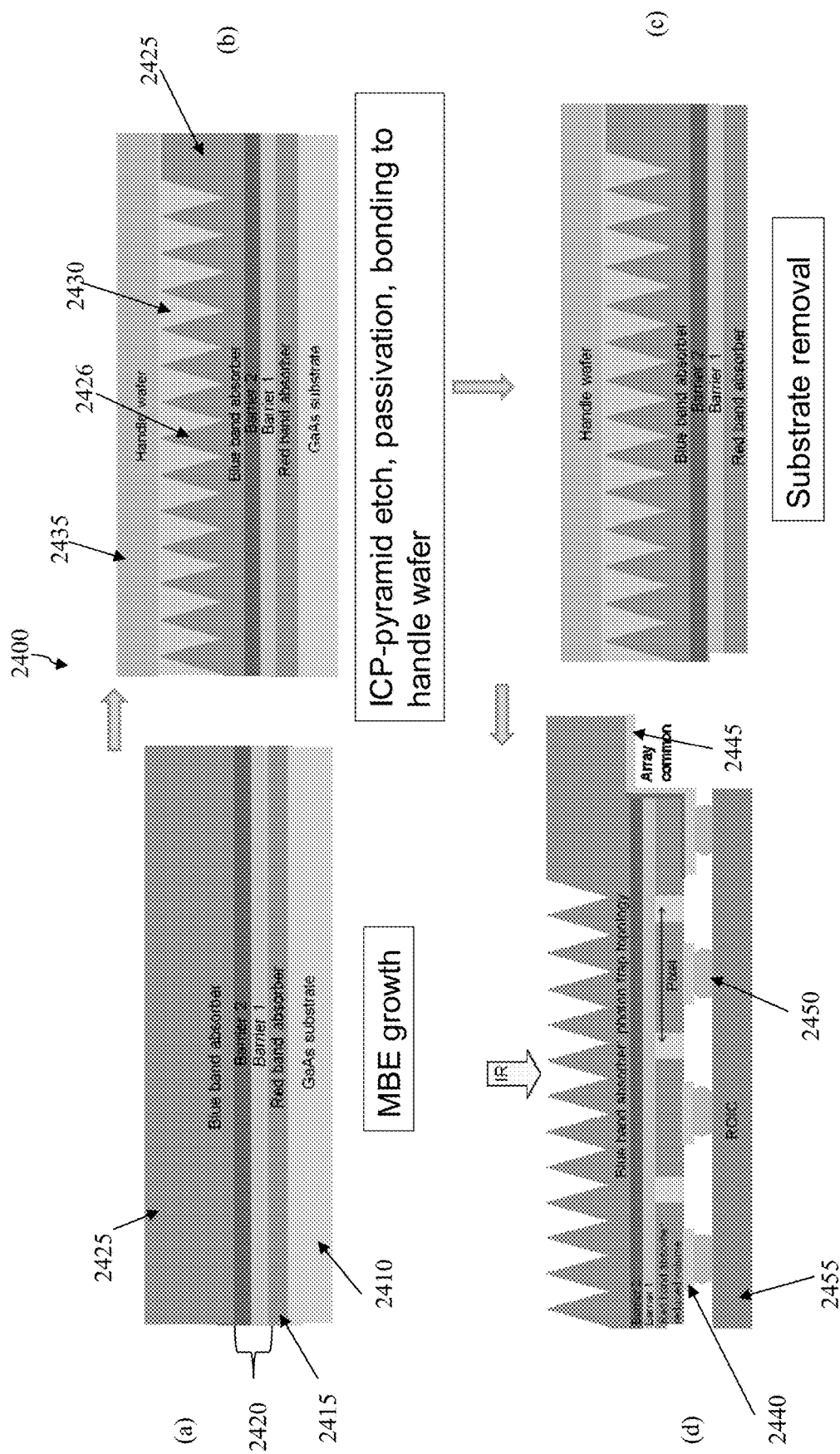
FIGS. 24a-d depict another embodiment according to the present disclosure.

Referring to FIGS. 24*a-d*, in one embodiment, a fabrication process 2400 for the presently disclosed detector array is presently described. Referring to FIG. 24*a*, the process 2400 comprises providing a substrate 2410 (such as, for example, InAs, GaSb or GaAs); forming a buffer layer (not shown) above the substrate 2410 using, for example, epitaxial growth; forming a collector layer (not shown) above the substrate 2410 using, for example, epitaxial growth; forming a band-2 absorber layer 2415 using, for example, epitaxial growth; forming a barrier layer 2420 using, for example, epitaxial growth. In some embodiments, the barrier layer 2420 comprises multiple layers. Referring to FIG. 24*a*, the process 2400 further comprises forming band-1 absorber layer 2425 using, for example, epitaxial growth; and optionally forming a pyramidal layer (not shown) from which pyramids are formed. In some embodiments, the grown epitaxial layers are not lattice matched to the substrate 2410.

Referring to FIG. 24*b*, the process 2400 comprises patterning pyramidal shapes 2426 in the band-1 absorber layer 2425. In some embodiments, the pyramidal shapes are patterned in the optional pyramidal layer (not shown) formed above the band-1 absorber layer 2425. In some embodiments, the pyramidal shapes 2426 are etched. Etched features of various sidewall angles as well as sidewall curvatures can be obtained by various dry etching (such as, for example, reactive ion etching or ion milling) and wet-chemical etching processes. In some embodiments, the exposed surfaces of the band-1 absorber layer 2425 may be coated with a surface passivation layer (not shown). In some embodiments, the etched recesses are filled with low-index dielectric material 2430 such as, for example, silicon dioxide, polyimide or benzo-cyclobutene.

Referring to FIG. 24*b*, the process 2400 further comprises mounting a carrier wafer 2435 adjacent to the pyramidal shapes 2426 and removing the substrate 2410.

Referring to FIG. 24*c*, the process 2400 further comprises patterning the collector layer (not shown) that was exposed after the removal of the substrate 2410. In some embodiments, the collector layer (not shown) is patterned using, for example, reactive ion etching processes or ion milling processes or using wet-chemical etching processes. In some embodiments, a dielectric coating (not shown) is applied to cover the exposed band-2 absorber layer 2415 and exposed interface between that absorber layer 2415 and the collector layer (not shown).

Referring to FIG. 24d, the process 2400 further comprises forming electrical contacts 2440. In some embodiments, additional fabrication steps may be used to remove the band-2 absorber layer 2415 from portions of the detector. In some embodiments, portions of the band-2 absorber layer 2415 and the barrier layer 2420 are removed to expose the band-1 absorber layer 2425. In some embodiments, electrical contacts 2445 are formed to the band-1 absorber regions 2425 for the array common, which is shared by multiple detector pixels.

In some embodiments, dielectric passivation coating (not shown) is deposited to cover the sides of the etched band-2 absorber layer 2415. In some embodiments, metal for the bonding pads 2440, which may serve as the metal reflector at the backside of the detector, are deposited and patterned. Materials such as, for example, TiAu and TiPtAu could be used for these electrical contacts 2440 as well as for the bonding pad. The contact metal also serves as an optical reflector. In some embodiments, solder bumps 2450 are formed to the bonding pads and the detector array can be bonded to a readout integrated circuit 2455. In some embodiments, the space between the bumps 2450 are filled with some material (not shown) for added mechanical strength. Finally, the handle wafer 2435 is removed to expose the pyramids 2426. The result is a detector array that has pyramids 2426 on its top side and that is attached to a readout integrated circuit 2455 at its back side.

FIG. 25 shows a detector array after the top-side features, whose desired shape is a pyramid, were etched. The sample fabricated has a checker-board pattern of regions with the etched features and regions with no etched features. The regions with the etched features appear dark to the eye and the unetched regions appear reflective (because of the high refractive index of the semiconductor material). The dark appearance of the etched regions verifies that the incident light is coupled effectively into the material underneath to be absorbed. Various masking materials such as dielectric oxides and metals could be used to define the etching of the desired pyramidal features. Also, the specific shape of the mask pattern can be designed to achieve a desired shape of the pyramids or cones.

FIG. 26a-c shows the detector array after the etching of the front-side pyramidal features, after the attachment of that sample to a handle wafer and removal of the growth substrate, and after the processing steps to define the individual detector pixels and form the metal contact pads.

Figure 27A:
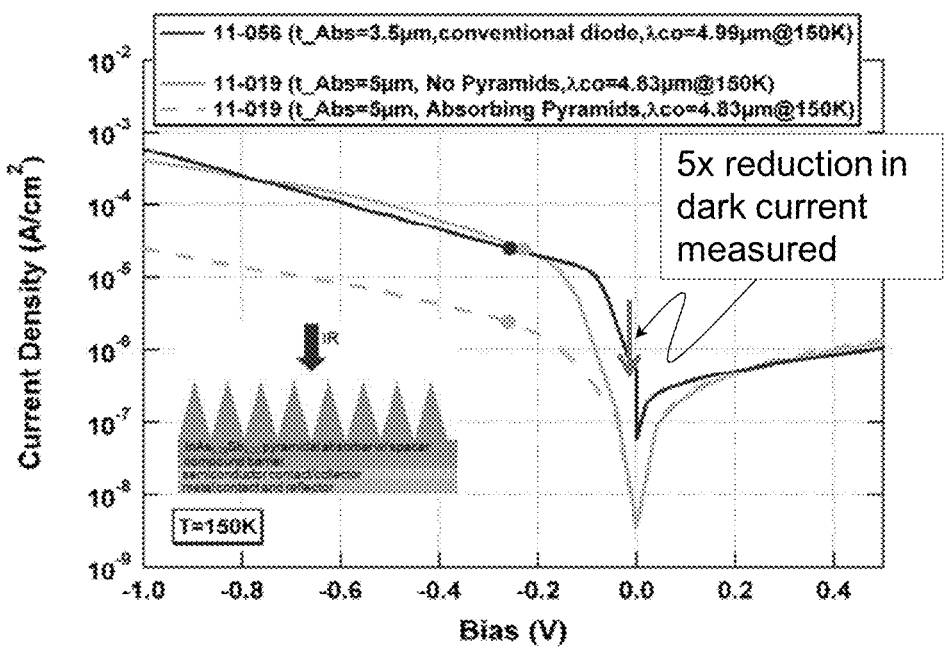
FIGS. 27a-b depict simulation results according to the present disclosure.
Figure 27B:
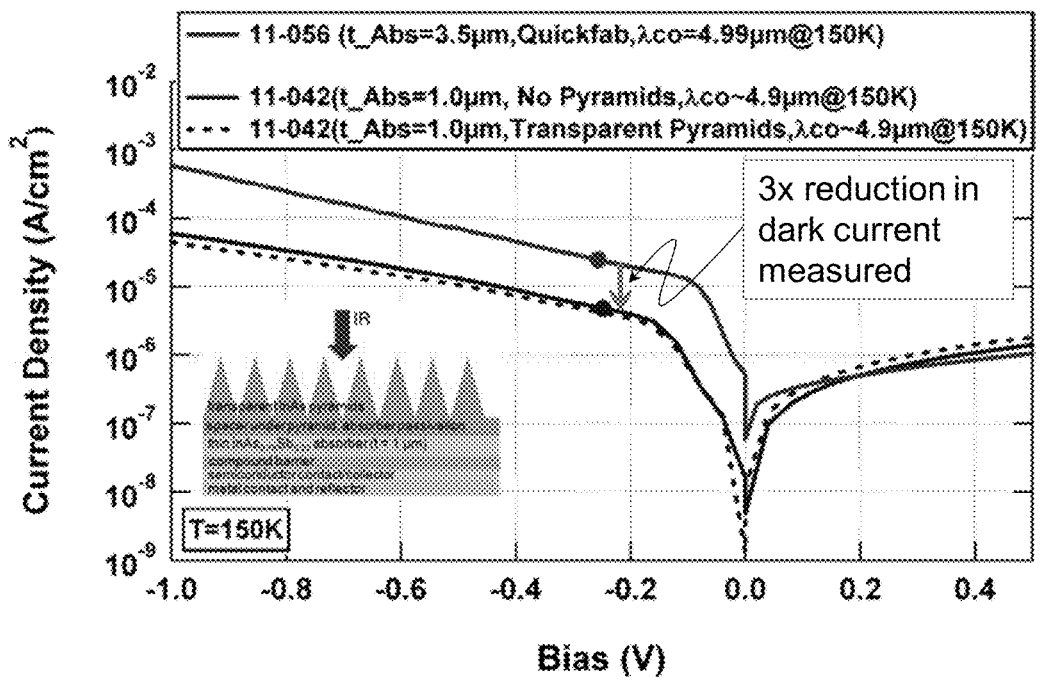

FIG. 27a shows a plot of the measured dark current density of a test detector that has light-absorbing pyramids. FIG. 27b a plot of the measure dark current density of a test detector that has a thin light-absorbing layer beneath transparent pyramids.

Measurements obtained for test detectors that were fabricated indicate that the dark current at a device temperature of 150 K can indeed be reduced by reducing the volume of absorber material. For example, when periodic features are etched into a layer of absorber material, a reduction of a factor of 5 in the dark current is achieved. The actual shape of these etched features resembles narrow cones rather than pyramids, with sizeable gaps between the bases of adjacent cones. This structure is indicative of the shorter-wavelength absorber of a dual-band detector. For example, it could be the MWIR absorber of a MWIR/LWIR detector. Also, it was verified that reduced dark current is obtained for a structure with thin absorber layer beneath a layer of transparent pyramids. The dark current, which was reduced by a factor of 3, is consistent with its reduced absorber volume (the thickness of the absorber layer was reduced from 3.5 µm to 1.0 µm). This test structure is indicative of the longer-wavelength absorber of a dual-band MWIR1/MWIR2 or SWIR/MWIR detector. The fabrication of pyramids above the absorber layer did not affect the dark current of that layer. It was also verified that the detector quantum efficiency can be increased by at least a factor of 2 when the etched conical features are added to a structure that has a thin absorber. An even greater improvement is expected in the quantum efficiency when the etching process is refined to make etched features that have pyramid shapes.

For the example whose absorption characteristics are shown in FIG. 12, the InAs absorber for the shorter-wavelength MWIR band achieved a cut-off wavelength at 150 K temperature of 3.3 µm. The $InAs_{0.78}Sb_{0.22}$ absorber for the longer-wavelength MWIR band achieved a cutoff wavelength at 150 K temperature of 4.95 µm. The two absorber materials do not have the same lattice constant and are not lattice-matched. Examples of the composite barrier structure located between the two absorber layers are described in the U.S. application Ser. No. 13/427,387 "Dual Band SWIR/MWIR and MWIR1/MWIR2 Infrared Detectors", filed on Mar. 22, 2012, which is incorporated herein by reference in its entirety. For one example, the structure includes two layers comprising AlInAsSb secondary barrier materials to avoid the formation of any depletion regions at the interfaces between these secondary barrier layers and the two light-absorber layers. Also, the structure includes a layer comprising AlInSb primary barrier material designed to ensure that the flow of holes through the composite barrier structure is not hindered while the flow of electrons is blocked. Other materials besides the ones used could be used for the two absorber layers and the barrier structure. For example, for an intermediate cutoff wavelength, such as one close to 4.2-4.3 µm, an absorber material such as $InAs_{0.91}Sb_{0.09}$ could be used. Composite barrier structures suitable for these other absorber materials are described in more detail in the U.S. application Ser. No. 13/427,387 "Dual Band SWIR/MWIR and MWIR1/MWIR2 Infrared Detectors", filed on Mar. 22, 2012, which is incorporated herein by reference in its entirety, could be used although some adjustment of the composition and doping of the layers comprising the barrier structure may be needed. For example, the valence band energy could be increased by increasing the percentage of AlSb in the AlInSb ternary material of the barrier structure.

In some embodiments, for a dual-band MWIR/LWIR detector, a ternary InAsSb alloy or a quaternary alloy may be used for the shorter-wavelength band. Since the absorber layer for this band is moderately tall (with a typical as-grown layer thickness of 5 to 8 µm), a ternary material may be more desirable than a Type II SLS material. Typically, a Type II SLS absorber for this wavelength band has fairly high resistance to carrier flow in the direction perpendicular to the plane of the layers. However, the longer-wavelength absorber layer can be much thinner than the maximum wavelength of that band. A LWIR absorber layer underneath a pyramidal structure could have a thickness of only 2.0-2.5 µm. Since this layer is fairly thin, it is reasonable to use a Type II SLS for the LWIR absorber. A composite barrier structure could then be designed to suit the valence and conduction band levels of the two absorber materials. For example, an AlGaSb material could present a barrier to electrons generated in the Type II SLS material but could have sufficiently low valence-band energy to not be a barrier to holes generated in the Type II SLS material.

Some embodiments of the presently disclosed detectors have dual-band nBn material structures such as those described in U.S. application Ser. No. 13/427,387 "Dual Band SWIR/MWIR and MWIR1/MWIR2 Infrared Detectors", filed on Mar. 22, 2012, which is incorporated herein by reference in its entirety. These structures have a composite-barrier comprising 3 thin layers of wider-bandgap material that block the flow of electrons between the two light-absorbing layers but permit the flow of holes between those light-absorbing layers. The composite-barrier is more effective than the prior single-layer barriers for avoiding the undesired depletion regions that contribute to the generation/recombination noise current.

In one embodiment, the presently disclosed dual-band infrared imagers are useful, for example, for determining the temperature of a thermal (e.g., black body) source emitting infrared (IR) radiation, as discussed by P. Mitra "Bias controlled multi-spectral infrared photodetector and imager," U.S. Pat. No. 6,897,447 B2, issued 24 May 2005, which is incorporated herein by reference in its entirety.

While several illustrative embodiments of the invention have been shown and described, numerous variations and alternative embodiments will occur to those skilled in the art. Such variations and alternative embodiments are contemplated, and can be made without departing from the scope of the invention as defined in the appended claims.

As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

The foregoing detailed description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "step(s) for . . . ."

What is claimed is:

1. An infrared photo-detector array comprising:
   a plurality of pyramid-shaped structures;
   a first light-absorbing material supporting the plurality of the pyramid-shaped structures;
   a carrier-selective electronic barrier supporting the first light-absorbing material, wherein the carrier-selective electronic barrier is to block a flow of a first electrical carrier type and is to permit a flow of a second electrical carrier type;
   a second light-absorbing material supporting the carrier-selective electronic barrier, the second light-absorbing material having a bandgap that permits absorption of light in a second wavelength band;
   a metal reflector supporting the second light-absorbing material, wherein the plurality of the pyramid-shaped structures are disposed on a side of the infrared photo-detector array to face incident light to be detected and the metal reflector is disposed on an opposite side of the infrared photo-detector array; and
   one or more collector regions disposed between the second light-absorbing material and the metal reflector, the collector regions comprising a material having a bandgap that permits absorption of light in the second wavelength band, and
   wherein the first light-absorbing material overlaps, in a plan view, a gap in the second light-absorbing material separating a first portion of the second light-absorbing material from a second portion of the second light-absorbing material.

2. The infrared photo-detector array of claim 1, wherein the first light-absorbing material has a bandgap that permits absorption of light in a first wavelength band.

3. The infrared photo-detector array of claim 2, wherein a thickness of the first light-absorbing material is smaller than 1.5 times the wavelength of the light in the first wavelength band.

4. The infrared photo-detector array of claim 2, wherein the bandgap of the second light-absorbing material is smaller than the bandgap of the first light-absorbing material.

5. The infrared photo-detector array of claim 2, wherein a thickness of the second light-absorbing material is smaller than the wavelength of the light in the second wavelength band.

6. The infrared photo-detector array of claim 1, wherein the first light-absorbing material has first lattice constant and the second light-absorbing material has a second lattice constant, wherein the first and second lattice constants are different.

7. The infrared photo-detector array of claim 1, wherein the first light-absorbing material comprises a binary, ternary or quaternary alloy and the second light-absorbing material comprises a binary, ternary or quaternary alloy.

8. The infrared photo-detector array of claim 1, wherein the first light-absorbing material comprises a binary, ternary or quaternary alloy and the second light-absorbing material comprises a short-period superlattice.

9. The infrared photo-detector array of claim 1, wherein the plurality of the pyramid-shaped structures absorb light in a first wavelength band and do not absorb light in a second wavelength band.

10. The infrared photo-detector array of claim 1, wherein the plurality of the pyramid-shaped structures do not absorb light in either a first or a second wavelength bands.

11. The infrared photo-detector array of claim 1, wherein the first electrical carrier type is electrons and the second electrical carrier type is holes.

12. The infrared photo-detector array of claim 1, wherein the carrier-selective electronic barrier comprises multiple layers of material whose bandgap is wider than the bandgap of the first light-absorbing material and the bandgap of the second light-absorbing material.

13. The infrared photo-detector array of claim 1, wherein the carrier-selective electronic barrier comprises an interface with the first light-absorbing material to not produce a depletion region of electron population in the first light-absorbing material.

14. The infrared photo-detector array of claim 1, wherein the carrier-selective electronic barrier comprises an interface with the second light-absorbing material to not produce a depletion region of electron population in the second light-absorbing material.

15. The infrared photo-detector array of claim 1, wherein an area of a collector region of the one or more collector regions is smaller than a corresponding area of a base of a pyramid-shaped structure of the plurality of pyramid-shaped structures.

16. The infrared photo-detector array of claim 1, wherein the collector regions are disposed beneath the centers of the pyramid-shaped structures in the plurality of the pyramid-shaped structures.

17. The infrared photo-detector array of claim 1, wherein each pyramid-shaped structure of the plurality of pyramid-shaped structures has a base that faces the second light-absorbing material, wherein at least a portion of the one or more collector regions arranged opposite the base of a pyramid-shaped structure has an area that is smaller than the area of the base of the pyramid-shaped structure, and wherein the one or more collector regions extends over at least two adjacent pyramid-shaped structures.

18. The infrared photo-detector array of claim 1, further comprises one or more regions of dielectric material, wherein the dielectric material is transparent to the light of a first and second wavelength bands and has a low refractive index compared to the refractive index of the first and second light-absorbing materials.

19. The infrared photo-detector array of claim 18, wherein the regions of dielectric material are disposed:
   in the gap between the first and second portions of the second light-absorbing material; and
   between a first portion of the metal reflector and a second portion of the metal reflector.

20. The infrared photo-detector array of claim 1, wherein the carrier-selective electronic barrier blocks flow of electrons between the first light-absorbing material and the second light-absorbing material.

21. The infrared photo-detector array of claim 1, wherein the carrier-selective electronic barrier allows flow of holes between the first light-absorbing material and the second light-absorbing material.

22. The infrared photo-detector array of claim 1, wherein the plurality of pyramid-shaped structures are in direct contact with the first light-absorbing material.

23. The infrared photo-detector array of claim 1, wherein the first light-absorbing material absorbs light in a short-wavelength band and the second light-absorbing material absorbs light in a longer-wavelength band.

24. The infrared photo-detector array of claim 1, wherein the collector regions are contiguous.

25. The infrared photo-detector array of claim 1, wherein a collector region of the one or more collector regions has a ring shape.

26. The infrared photo-detector array of claim 1, further comprising one or more regions of dielectric material disposed:
   between the second light-absorbing material and the metal reflector,
   in the gap between the first and second portions of the second light-absorbing material, and
   between a first portion of the metal reflector and a second portion of the metal reflector.

27. The infrared photo-detector array of claim 1, wherein the one or more collector regions comprise a plurality of collector regions, and
   wherein the infrared photo-detector array further comprises one or more regions of dielectric material disposed:
   between the second light-absorbing material and the metal reflector, and
   in a gap between two collector regions of the plurality of collector regions.

28. A method to detect light of two infrared bands, the method comprising:
   forming a carrier-selective electronic barrier, wherein the carrier-selective electronic barrier blocks flow of a first electrical carrier type and permits flow of a second electrical carrier type;
   forming a first light-absorbing material above the carrier-selective electronic barrier;
   forming a plurality of pyramid-shaped features above the first light-absorbing material;
   forming a second light-absorbing material having a bandgap that permits absorption of light in a second wavelength band, the second light-absorbing material having a gap separating a first portion of the second light-absorbing material from a second portion of the second light-absorbing material, the gap overlapping the first light-absorbing material in a plan view;
   forming one or more collector regions, the collector regions comprising a material having a bandgap that permits absorption of light in the second wavelength band; and
   providing a metal reflector.

29. An infrared photo-detector array comprising:
   a plurality of pyramid-shaped structures;
   a first light-absorbing material supporting the plurality of the pyramid-shaped structures;
   a carrier-selective electronic barrier supporting the first light-absorbing material, wherein the carrier-selective electronic barrier is to block a flow of a first electrical carrier type and is to permit a flow of a second electrical carrier type;
   a second light-absorbing material supporting the carrier-selective electronic barrier;
   a metal reflector supporting the second light-absorbing material, wherein the plurality of the pyramid-shaped structures are disposed on a side of the infrared photo-detector array to face incident light to be detected and the metal reflector is disposed on an opposite side of the infrared photo-detector array; and
   one or more collector regions disposed between the second light-absorbing material and the metal reflector, a collector region of the one or more collector regions having an area that is smaller than an area of a base of the pyramid-shaped structures and extends over at least two adjacent pyramid-shaped structures, and
   wherein the first light-absorbing material overlaps, in a plan view, a gap in the second light-absorbing material separating a first portion of the second light-absorbing material from a second portion of the second light-absorbing material.

* * * * *